(12) United States Patent
Salmon

(10) Patent No.: US 7,427,809 B2
(45) Date of Patent: Sep. 23, 2008

(54) REPAIRABLE THREE-DIMENSIONAL SEMICONDUCTOR SUBSYSTEM

(75) Inventor: Peter C. Salmon, Mountain View, CA (US)

(73) Assignee: Salmon Technologies, LLC, Mountain View, CA (US)

( * ) Notice: Subject to any disclaimer, the term of this patent is extended or adjusted under 35 U.S.C. 154(b) by 31 days.

(21) Appl. No.: 11/015,213

(22) Filed: Dec. 16, 2004

(65) Prior Publication Data
US 2006/0131728 A1 Jun. 22, 2006

(51) Int. Cl.
*H01L 29/40* (2006.01)
*H01L 23/34* (2006.01)

(52) U.S. Cl. .................. 257/773; 257/719; 257/778; 257/E23.003; 257/E23.078; 257/E23.083

(58) Field of Classification Search ............. 257/719, 257/773, 778, E23.003, E23.078, E23.083
See application file for complete search history.

(56) References Cited

U.S. PATENT DOCUMENTS

| | | | |
|---|---|---|---|
| 4,455,654 A | 6/1984 | Bhaskar et al. .............. 714/28 |
| 4,748,495 A | 5/1988 | Kucharek .................. 257/713 |
| 4,862,322 A | 8/1989 | Bickford et al. ............. 361/718 |
| 4,912,844 A | 4/1990 | Parker ......................... 29/848 |
| 4,997,791 A | 3/1991 | Ohuchi et al. .............. 437/209 |
| 5,001,548 A | 3/1991 | Iversen ....................... 257/714 |
| 5,070,297 A | 12/1991 | Kwon et al. ................ 324/754 |
| 5,159,529 A | 10/1992 | Lovgren .................... 361/699 |
| 5,162,974 A | 11/1992 | Currie ........................ 361/702 |
| 5,214,250 A | 5/1993 | Cayson et al. ............... 438/73 |
| 5,239,200 A | 8/1993 | Messina et al. ............ 257/714 |
| 5,239,448 A | 8/1993 | Perkins et al. ............. 361/764 |
| 5,267,867 A | 12/1993 | Agahdel et al. .............. 439/73 |
| 5,281,151 A | 1/1994 | Arima et al. .................. 439/68 |
| 5,290,970 A | 3/1994 | Currie ........................ 174/250 |
| 5,291,064 A | 3/1994 | Kurokawa .................. 257/714 |
| 5,300,810 A | 4/1994 | Eden .......................... 257/686 |
| 5,305,184 A | 4/1994 | Andresen et al. .......... 361/699 |

(Continued)

FOREIGN PATENT DOCUMENTS

JP 07169873 A 7/1995

OTHER PUBLICATIONS

Chow, Eugene M. et al., "Process Compatible Polysilicon-Based Electrical Through-Wafer Interconnects in Silicon Substrates", *Journal of Microelectromechanical Systems*, Vo. 11, No. 6, Dec. 2002, pp. 631-640.

(Continued)

*Primary Examiner*—Evan Pert
(74) *Attorney, Agent, or Firm*—Dorsey & Whitney LLP

(57) ABSTRACT

A tightly packed three-dimensional electronic system or subsystem comprising multiple stacks of semiconductor elements is described. The system is repairable because the elements connect together using re-workable flip chip connectors; each flip chip connector comprises a conductive spring element on one side and a corresponding well filled with solder on the other side. The spring elements relieve stresses at the interfaces and allow the component stacks to remain flat; they also provide vertical compliance for easing assembly of elements that have been imperfectly thinned or planarized. Semiconductor integration platforms may be used to integrate active and passive devices, multi-layer interconnections, through wafer connections, I/O plugs, and terminals for attachment of other semiconductor elements or cables.

16 Claims, 17 Drawing Sheets

U.S. PATENT DOCUMENTS

| | | | |
|---|---|---|---|
| 5,334,279 A | 8/1994 | Gregoire | 216/20 |
| 5,367,593 A | 11/1994 | Lebby et al. | 385/53 |
| 5,390,412 A | 2/1995 | Gregoire | 29/848 |
| 5,451,722 A | 9/1995 | Gregoire | 174/261 |
| 5,461,327 A | 10/1995 | Shibata et al. | 324/760 |
| 5,510,758 A | 4/1996 | Fujita et al. | 333/247 |
| 5,579,574 A | 12/1996 | Colleran et al. | 29/840 |
| 5,627,406 A | 5/1997 | Pace | 257/700 |
| 5,635,767 A | 6/1997 | Wenzel et al. | 257/778 |
| 5,640,051 A | 6/1997 | Tomura et al. | 257/778 |
| 5,701,666 A | 12/1997 | DeHaven et al. | 29/831 |
| 5,736,850 A | 4/1998 | Legal | 324/158.1 |
| 5,774,475 A | 6/1998 | Qureshi | 714/726 |
| 5,786,986 A | 7/1998 | Bregman et al. | 361/719 |
| 5,797,771 A | 8/1998 | Garside | 439/610 |
| 5,800,060 A | 9/1998 | Speckbrock et al. | 374/104 |
| 5,847,936 A | 12/1998 | Forehand et al. | 361/794 |
| 5,900,738 A * | 5/1999 | Khandros et al. | 324/761 |
| 5,959,462 A | 9/1999 | Lum | 324/765 |
| 5,972,152 A | 10/1999 | Lake et al. | 156/247 |
| 5,986,887 A | 11/1999 | Smith et al. | 361/704 |
| 5,998,738 A | 12/1999 | Li et al. | 174/250 |
| 6,005,198 A | 12/1999 | Gregoire | 174/262 |
| 6,103,554 A | 8/2000 | Son et al. | 438/126 |
| 6,121,676 A | 9/2000 | Solberg | 257/686 |
| 6,138,348 A | 10/2000 | Kulesza et al. | 29/840 |
| 6,161,921 A | 12/2000 | Bard et al. | 347/55 |
| 6,174,804 B1 | 1/2001 | Hsu | 438/238 |
| 6,208,511 B1 | 3/2001 | Bortolini et al. | 361/698 |
| 6,210,229 B1 | 4/2001 | Lai | 439/610 |
| 6,225,688 B1 | 5/2001 | Kim et al. | 257/686 |
| 6,246,010 B1 | 6/2001 | Zenner et al. | 174/260 |
| 6,304,447 B1 | 10/2001 | Bortolini et al. | 361/699 |
| 6,310,484 B1 * | 10/2001 | Akram et al. | 324/754 |
| 6,372,549 B2 | 4/2002 | Urushima | 438/118 |
| 6,392,301 B1 | 5/2002 | Waizman et al. | 257/774 |
| 6,416,171 B1 | 7/2002 | Schmidlin | 347/55 |
| 6,441,476 B1 | 8/2002 | Emoto | 257/686 |
| 6,460,247 B1 | 10/2002 | Gregoire | 29/848 |
| 6,462,532 B1 | 10/2002 | Smith | 324/158.1 |
| 6,476,885 B1 | 11/2002 | Murray et al. | 349/60 |
| 6,480,395 B1 | 11/2002 | Kopf | 361/760 |
| 6,515,870 B1 | 2/2003 | Skinner et al. | 361/800 |
| 6,528,891 B2 | 3/2003 | Lin et al. | 257/778 |
| 6,531,022 B1 | 3/2003 | Tsukahara | 156/256 |
| 6,587,345 B2 | 7/2003 | Chu et al. | 361/719 |
| 6,611,057 B2 | 8/2003 | Mikubo et al. | 257/714 |
| 6,631,344 B1 | 10/2003 | Kapur et al. | 703/22 |
| 6,677,776 B2 | 1/2004 | Akram et al. | 324/765 |
| 6,683,377 B1 | 1/2004 | Shim et al. | 257/723 |
| 6,690,845 B1 | 2/2004 | Yoshimura et al. | 385/14 |
| 6,717,812 B1 | 4/2004 | Pinjala et al. | 361/699 |
| 6,722,893 B2 * | 4/2004 | Li et al. | 439/66 |
| 6,749,587 B2 | 6/2004 | Flaherty | 604/151 |
| 6,763,880 B1 | 7/2004 | Shih | 165/80.4 |
| 6,784,554 B2 | 8/2004 | Kajiwara et al. | 257/778 |
| 6,829,574 B1 | 12/2004 | Ito et al. | 703/28 |
| 6,845,477 B2 | 1/2005 | Hidaka | 714/729 |
| 6,880,350 B2 | 4/2005 | Tilton | 62/171 |
| 6,881,609 B2 | 4/2005 | Salmon | 438/107 |
| 6,891,732 B2 | 5/2005 | Takano et al. | 361/783 |
| 6,927,471 B2 | 8/2005 | Salmon | 257/499 |
| 6,938,678 B1 | 9/2005 | Bortolini et al. | 165/80.4 |
| 6,942,493 B2 | 9/2005 | Matsunaga et al. | 439/66 |
| 6,955,063 B2 | 10/2005 | Adiga et al. | 62/259.2 |
| 6,956,284 B2 | 10/2005 | Cady et al. | 257/685 |
| 6,956,285 B2 | 10/2005 | Radu et al. | 257/697 |
| 6,973,717 B2 | 12/2005 | Hacke et al. | 29/840 |
| 6,990,176 B2 | 1/2006 | Sherman et al. | 378/98.8 |
| 7,009,412 B2 | 3/2006 | Chong et al. | 324/754 |
| 7,018,917 B2 | 3/2006 | Elers | 438/622 |
| 7,040,383 B2 | 5/2006 | Oyamada | 165/104.33 |
| 7,078,926 B2 | 7/2006 | Khandros et al. | 324/765 |
| 7,163,830 B2 | 1/2007 | Salmon et al. | 438/18 |
| 7,180,165 B2 | 2/2007 | Ellsberry et al. | 257/686 |
| 7,224,856 B2 | 5/2007 | Kathman et al. | 385/14 |
| 7,254,024 B2 | 8/2007 | Salmon | 361/699 |
| 2002/0030975 A1 | 3/2002 | Moon | 361/749 |
| 2002/0121689 A1 | 9/2002 | Honda | 257/700 |
| 2003/0035473 A1 | 2/2003 | Takinosawa | 375/224 |
| 2003/0106004 A1 | 6/2003 | Richetti et al. | 714/733 |
| 2003/0167144 A1 | 9/2003 | Wang et al. | 702/119 |
| 2003/0168725 A1 | 9/2003 | Warner et al. | 257/686 |
| 2004/0012383 A1 | 1/2004 | Kimura | 324/158.1 |
| 2004/0148121 A1 | 7/2004 | deObaldi et al. | 702/117 |
| 2004/0176924 A1 | 9/2004 | Salmon | 702/125 |
| 2005/0040513 A1 | 2/2005 | Salmon | 257/734 |
| 2005/0168231 A1 | 8/2005 | Kim | 324/754 |
| 2005/0184376 A1 | 8/2005 | Salmon | 257/686 |
| 2005/0255722 A1 | 11/2005 | Salmon | 439/67 |
| 2006/0077638 A1 * | 4/2006 | Salmon | 361/704 |
| 2006/0145715 A1 | 7/2006 | Salmon | 324/754 |
| 2006/0209512 A1 | 9/2006 | Taniguchi et al. | 361/699 |
| 2007/0007983 A1 | 1/2007 | Salmon | 325/754 |
| 2007/0023889 A1 | 2/2007 | Salmon | 257/690 |
| 2007/0023904 A1 | 2/2007 | Salmon | 385/49 |
| 2007/0023923 A1 | 2/2007 | Salmon | 257/296 |
| 2007/0025079 A1 | 2/2007 | Salmon | 361/699 |

OTHER PUBLICATIONS

Gutmann, R. J. et al., "Wafer-Level Three-Dimensional ICs: A Better Solution Than SoCs and SiPs?", 6 pgs.

Davis & Arledge, "Thin Film Metallization of Three Dimensional Substrates," Electronic Components Technology Conference, Proceedings 44th, pp. 359-361, May 1-4, 1994.

Holden, Happy, "A Design Technology Innovation—The Power Mesh Architecture for PCBs", The Board Authority, Dec. 2000, pp. 2-6.

Kreider, Kenneth G. et al., "High Temperature Materials For Thin-Film Thermocouples On Silicon Wafers", Chemical Science and Technology Laboratory, NIST, Gaithersburg, Maryland, USA, date unknown.

Sensu, Yoshihisa et al., "Study on Improved Resolution of Thick Film Resist (Verification by Simulation)", SPIE, 2001.

* cited by examiner

FIG. 5B  FIG. 5C

REPAIRABLE THREE-DIMENSIONAL SEMICONDUCTOR SUBSYSTEM

This invention relates to methods for integrating electronic systems or subsystems, and more particularly to a repairable three dimensional electronic subsystem wherein semiconductor elements are closely packed and can be replaced if they prove to be defective.

BACKGROUND OF THE INVENTION

A common form of electronic subsystem includes a printed circuit board (PCB) with multiple packaged components assembled onto the board, wherein each packaged component includes a semiconductor chip or die. As the clock rate of electronic subsystems has increased, it has become desirable to make smaller and smaller packages. The smaller packages typically have shorter lead lengths with lower inductance, and the lower inductance enables higher speed operation. Flip-chip packages represent an extension of this trend, comprising bumped die directly attached to a package substrate or PCB. The bumps have typically been solder balls arranged in ball grid arrays (BGAs).

BGA attachments are quite rigid because the solder balls are essentially rugged little spheres composed of strong bonding material. The attachment between chip and substrate comprising an array of such spheres is stiff rather than compliant. Since semiconductor materials expand and contract at slower rates than typical substrates, temperature excursions cause shear forces to develop at the interface between chip and substrate. These temperature excursions occur during both manufacture and operation. The shear stresses may cause buckling, cracking or de-lamination. This aspect of semiconductor packaging has been much described in the literature. In practice, BGA attachments using solder balls only work satisfactorily for die sizes up to around 3 mm on a side, unless an epoxy under-layer is used to help bind things together. However, if an epoxy under-layer is used, it is almost impossible to rework an assembled die that proves to be defective.

A typical microprocessor chip has an edge dimension of around 18 mm. For assembling this larger die using flip chip attachments (and avoiding an epoxy under layer) an improved flip chip connector is required. This improved flip chip connector will preferably have flexible connections that are compliant enough to absorb the maximum shear stresses that can occur.

The flip chip connectors attach to input/output pads on the front side of an IC chip. The back side of the chip typically requires attachment to a heat sink; especially for microprocessors that dissipate 100-150 watts (W) of heat today, and are projected to dissipate nearly 500 W by 2010. The heat sink is typically constructed from a good heat conductor such as copper, and copper has similar expansion properties to glass-epoxy laminate materials used as PCB substrates. Thermal grease has been used at this interface. It conducts heat between chip and heat sink, yet allows them to slide against each other to relieve shear stress. However, thermal grease is not conductive enough to meet the heat-sinking requirements projected for 2010. Accordingly, a new device called an interface adaptor has been proposed for attaching the semiconductor substrate to the heat sink. The interface adaptor has flexible copper fingers that are thermally conductive and can absorb lateral displacements (shear stresses); such interface adaptors are included in the preferred embodiment of the current invention. The details of construction and manufacture of these interface adaptors is described in co-pending U.S. patent application Ser. No. 10/997,566.

Wafer level packaging (WLP) is a recent manufacturing strategy. It extends the economies of scale inherent in wafer manufacturing to include elements of the packaging solution. It will be shown that the preferred flip chip connectors of the current invention can be fabricated using wafer level processes; the same is true for the proposed interface adaptors. A typical microprocessor chip measures 18 mm on a side and 177 of them fit on a 300 mm wafer. At 90% yield, 159 will be functional. In this case the proposed additional back-end wafer fabrication costs are spread over 159 good die.

A popular series of mask aligners for wafer level packaging work is manufactured by Suss MicroTec AG based in Munich, Germany. These are full field proximity aligners and include the MA300Plus for 300 mm wafers. This aligner is primarily designed for exposing semiconductor wafers. However, it can also be used to expose square substrates of similar thickness. For fabricating the high-performance cables of the current invention the preferred substrate is a 300 mm square blank of cold rolled copper having a thickness of 400-800 µm.

New processes have been developed by Eugene M. Chow et al. for polysilicon based through-wafer interconnects (polysilicon feedthroughs) in silicon substrates: "Process Compatible Polysilicon-Based Electrical Through-Wafer Interconnects in Silicon Substrates", Journal of Micro-electro-mechanical Systems, Vol. II, No. 6, December 2002. The feedthroughs are produced in wafers 400 µm thick and have a diameter of 20 µm. Each feedthrough has a series resistance of 10-14 Ω, and less than 1 pF capacitance. The fabrication process employs high temperatures, and the finished wafers are "process compatible"; this means that they can be subsequently processed to produce active and passive devices using conventional fabrication methods. Wafers fabricated in this manner are preferably used in the current invention to produce input/output (I/O) plugs, as will be further described.

New alignment methods have been developed for pick and place machines, for accurately placing die on substrates employing flip-chip attachments. One such method known in the art uses split-beam optics and achieves an alignment accuracy of ±1 µm.

Three dimensional semiconductor assemblies have been produced in several forms. One popular form is a "stacked die" approach for producing a system in package (SiP). Typically the stack includes one chip per layer. Although either flip chip or wire bond connections can be used, the majority of stacked die arrangements have used wire bonds. With wire bonding, the bonding pads are typically available only at the chip periphery; not in area arrays as for typical flip chip. This limitation severely constrains how wire-bonded chips can be combined; the pad order must be taken into account or else the bonding wires will cross, producing short circuit failures. Also the chip sizes in the stack are constrained in order that the bonding tool can access all of the pads. In addition, the chips must be thick enough and strong enough for making bonds on any overhanging (cantilevered) edges; the bonding action requires the application of force that is transferred from the bonding tool to the bonding surface. These factors have limited the complexity of stacked semiconductor assemblies using wire bonds to around 4 or 5 chips maximum. Also, since the bonding wires are typically long compared with flip chip connectors, the associated inductance limits the signaling speed. Conversely, improved flip chip connections of the current invention have low inductance and are projected to support signaling rates up to 10 Gbps.

Three dimensional (3D) silicon structures have also been proposed employing bonded wafer-to-wafer assemblies. R. J.

Gutman et al. have described processes for aligning the wafers, bonding the wafers using low temperature adhesives, precision thinning and leveling, and inter-wafer connections using high aspect ratio vias: "Wafer-Level Three-Dimensional ICs: A Better Solution than SoCs and SiPs?", International Wafer Level Packaging Congress, San Jose Calif., October 2004. The resulting 3D circuits have excellent electrical performance because the signaling distances from wafer to wafer are as short as a few microns. However the manufacturing infrastructure required to produce these structures is substantial. Also fundamental difficulties remain including: yield hits when any portion of the assembly is defective; lack of thermal management strategies; lack of effective test strategies; the need for stacked components to have the same area; and the need to synchronize die shrinks of stacked components. Of these limitations, the only one that applies to subsystems created using methods of the current invention is the need to synchronize die shrinks of stacked components.

SUMMARY OF THE INVENTION

The current invention is an electronic subsystem created as a stacked semiconductor assembly. The assembly may include multiple semiconductor integration platforms, each with multiple semiconductor elements (IC chips) attached. The integration platforms may be interconnected using a new device called an input/output plug, or alternatively using high performance cables. Preferably, all of the semiconductor elements and cables interconnect using improved flip chip connectors that provide the capability to replace any elements that prove defective. Each connector includes a male part and a female part. The male part is preferably a compliant metallic spring element and the female part is preferably a well filled with solder. Copper is the preferred metallic material; however other metals can be used providing they can be electroformed.

Die that are attached to integration platforms can be of any arbitrary size that fits on the platform. Also, heterogeneous die such as digital, analog, radio frequency (RF), and optical can all use the improved flip chip connectors in a standard manner.

One or more of the integration platforms may include an interface adaptor for superior thermal performance (low thermal impedance from junction to case, $\theta_{JC}$). The interface adaptor is preferably designed to serve multiple functions; in addition to the thermal interface function it may also provide physical support for the stacked semiconductor assembly and relief of mechanical stresses.

BRIEF DESCRIPTION OF THE DRAWINGS

The foregoing and other objects of the invention will be more clearly understood from reading the following description of the invention in conjunction with the accompanying drawings in which:

FIG. 3B is an expanded view of area B of FIG. 3A;

FIG. 5B is an expanded cross-sectional view of polysilicon through-wafer interconnects used in the preferred embodiment of an input/output plug;

FIG. 5C shows in cross-section the use of copper mesa bumps as alternative terminals of an input/output plug;

DETAILED DESCRIPTION OF THE PREFERRED EMBODIMENTS

Figure 1A:
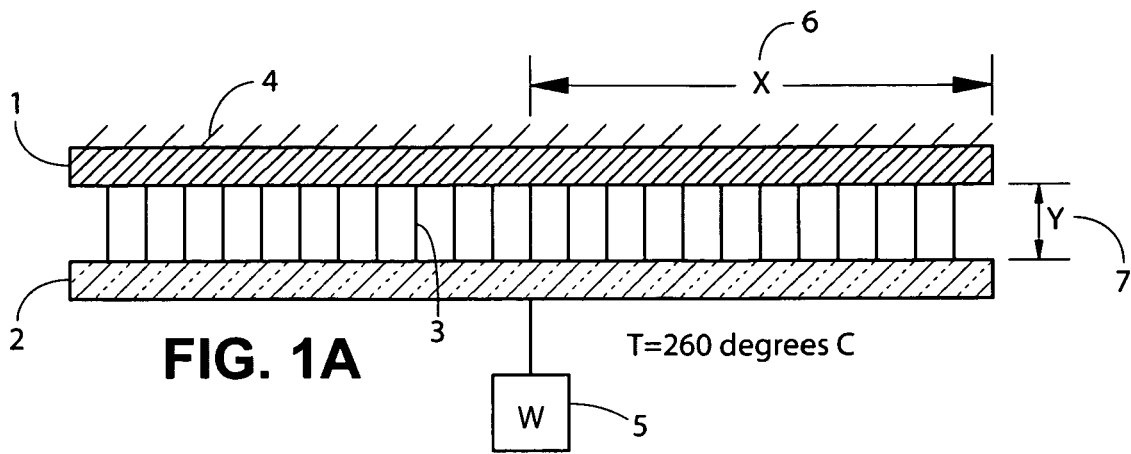
FIG. 1A is a schematic representation of a hypothetical interface between two elements having different thermal expansion characteristics.

A hypothetical structure is depicted for studying expansion effects at an electrical interface between two objects composed of dissimilar materials. FIG. 1A shows a semiconductor element 1 opposing a laminate element 2 with electrical connectors 3 spaced between them. Element 1 is fixed in position 4, and element 2 is pulled downward using a weight W, 5, which keeps the connectors in tension. The length of the elements measured from the center to the edge is X, 6, and the height of connectors 3 is Y, 7. The assembly temperature is 260° C., corresponding to a common peak reflow temperature for lead-free solder. The CTE of element 1 is 3 parts per million per degree Centigrade (ppm/° C.), and the CTE of element 2 is 17 ppm/° C., corresponding to silicon and glass-epoxy laminate, respectively.

Figure 1B:
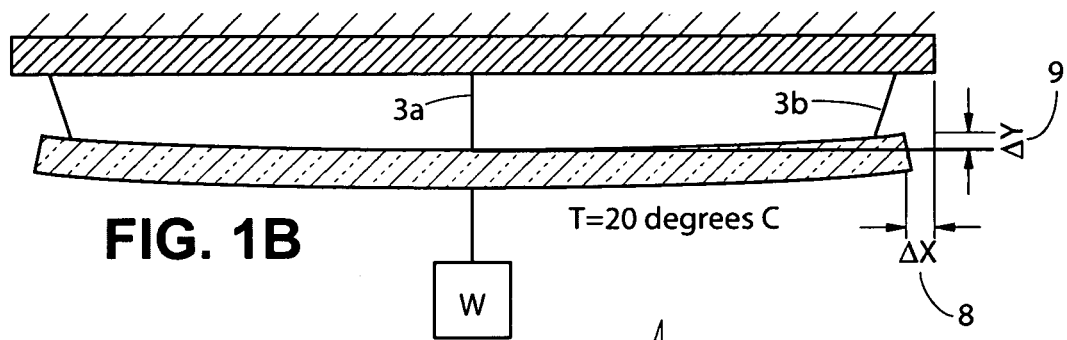
FIG. 1B shows the interface of FIG. 1A after cooling by 240 degrees Centigrade.
Figure 1C:
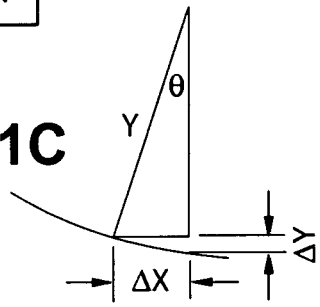
FIG. 1C illustrates the geometry of connector 3b of FIG. 1B.

FIG. 1B illustrates what happens when the structure is cooled to room temperature, 20° C. Center connector 3a is in a neutral position and remains vertical. Outermost connector 3b is pulled toward the center by element 2 which has shrunk more than element 1 during the cooling temperature transition of 240° C. Assuming that the connectors have constant length, the change in length of element 2 relative to element 1, ΔX, 8, and the change in height ΔY, 9 can be calculated as follows, using the geometry of FIG. 1C. X and Y are 10,0001 μm and 100 μm, respectively; typical dimensions for a microprocessor attachment of the current invention.

$$\Delta X = (X \times (17-3) \times 10E-6) \times (260-20) = 33.6 \text{ μm}$$

$$\theta = \sin^{-1}(\Delta X/Y) = 19.6 \text{ deg.}$$

$$\Delta Y = Y(1-\cos\theta) = 5.8 \text{ μm}$$

Figure 1D:
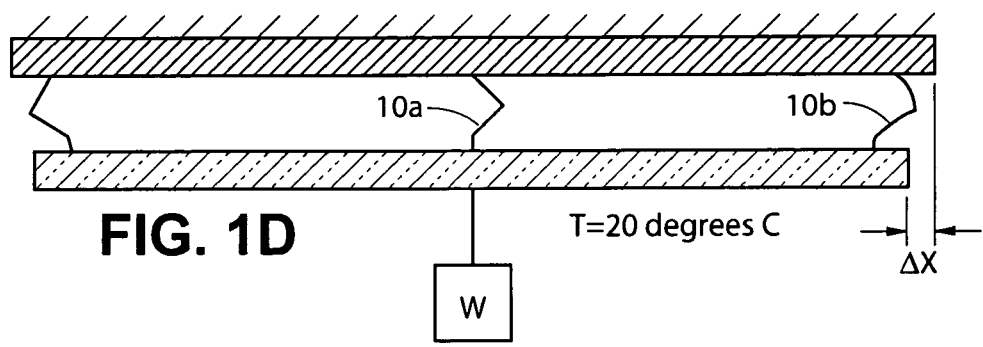
FIG. 1D depicts the use of improved connectors of the current invention, and shows that the assembly can remain flat for stacking purposes.

To create a stackable component from a pair of stacked elements it would be preferable for the assembly to remain flat as the temperature changes, thus avoiding problematic stresses and dimensional changes. This can be accomplished if the connecting elements are compliant; i.e., able to absorb a lateral displacement of 33.61 μm plus a vertical displacement of 5.8 μm for the case depicted. The proposed solution of the current invention is shown in FIG. 1D wherein connecting elements 10a and 10b have a bend in them that acts like a spring. The bend in the spring element can expand and contract to accommodate any necessary change in length, within limits defined by the size and angle of the bend. In this manner, such spring-like elements can relieve stresses in the horizontal plane as well as normal to the horizontal plane. The ΔX displacement is accommodated by having sufficient length and also sufficient flexibility for the bottom end to move laterally with respect to the top end, as shown for spring element 10b. ΔY displacements are accommodated by the bend which can expand and contract as required, as long as the displacement is not too large compared with the bend dimensions. This analysis provides technical background for the improved flip chip connectors of the current invention, to be further described.

Figure 2A:
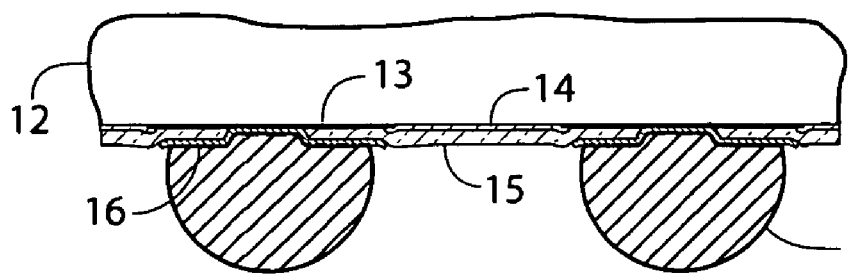
FIG. 2A-2D illustrates in cross-section a sequence for forming a prior art flip chip attachment using a solder ball connector.

FIG. 2A-2D illustrates a sequence for forming a solder ball flip chip attachment according to the prior art. In FIG. 2A semiconductor substrate 12 has input/output pads 13 at openings in a passivation layer 14. Fabricated on passivation layer 14 is a layer of dielectric material 15 with openings over the input/output pads. Dielectric material 15 is typically benzo cyclo butene (BCB), a photo-imageable spin-on dielectric sold by The Dow Chemical Company under the trade name Cyclotene. An under bump metallization (UBM) 16 is provided as shown. Many UBM formulations are known in the art; generally they require tailoring to the particular solder used. For tin-based solders a typical UBM sequence includes a sputtered layer approximately 300 nm thick of titanium/copper, followed by an electroplated layer 2-5 μm thick of nickel. Solder balls 17 are typically created using electroplated solder material; during reflow the surface tension of the molten solder pulls them into their spherical shape.

Figure 2B:
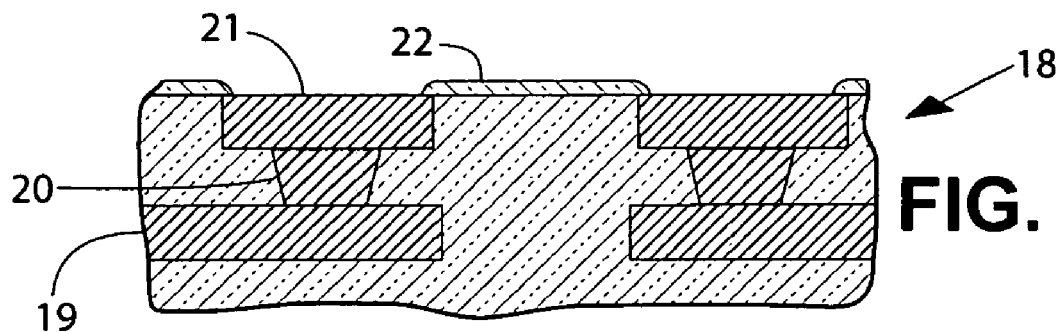

FIG. 2B shows a printed circuit board (PCB) 18 built from glass-epoxy laminate materials, as is known in the art. Circuit board 18 has copper conductors (traces) 19 that connect using vias 20 to copper lands 21, encircled by solder mask material 22.

Figure 2C:
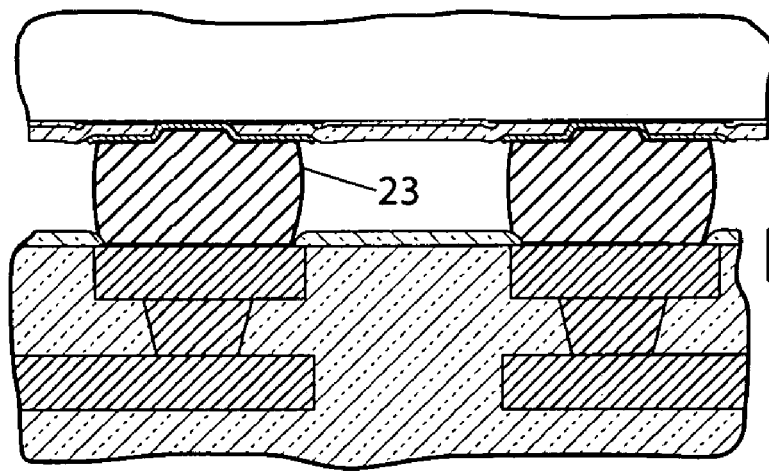
Figure 2D:
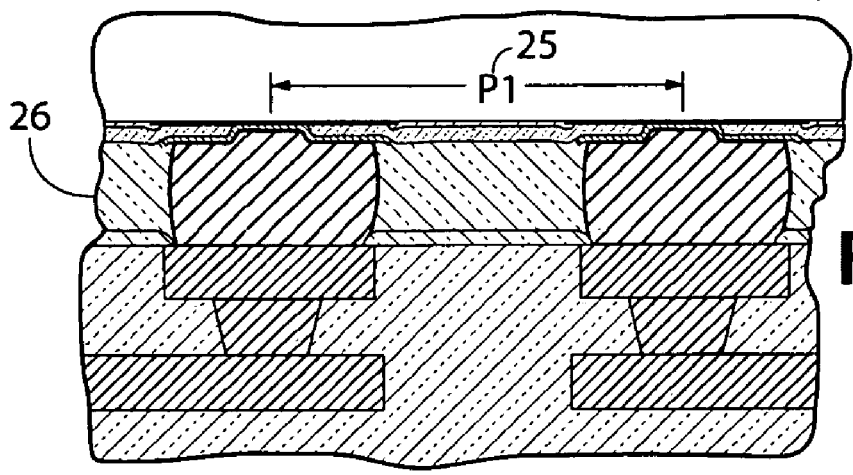

Assembly of the flip chip connection (direct chip attachment) is achieved by aligning the solder balls (bumps) with the lands, bringing them together, and re-flowing the solder to form solder columns 23, as shown in FIG. 2C. Solder columns 23 form a mechanical attachment as well as an electrical conduit for passing signals between input/output pads 13 on semiconductor substrate 12 and lands connected to traces on PCB 18. This attachment is called herein a solder ball connector 24, shown in FIG. 2D. The smallest solder balls using plated bumps are typically around 100 μm in diameter and the corresponding pitch P1, 25, is typically 150-200 μm. A potential problem with this attachment method is that any variation in height of solder balls 17 will cause air gaps between the smaller balls and their corresponding lands. This air gap may cause weak solder joints or opens. Consequently, pressure is typically applied to the semiconductor substrate to eliminate the air gaps, and this can cause breakage of semiconductor substrate 12. The CTE of silicon is around 3 ppm/° C. while the CTE of the epoxy laminate substrate is typically around 17 ppm/C. This mismatch in expansion characteristics causes shear stresses at the interface, discussed in reference to FIG. 1. These stresses are induced when the temperature changes during manufacture or operation in the intended application. The shear stresses can cause buckling, cracking, or de-lamination. It has been determined that in many packaging environments, ball grid array (BGA) structures will operate reliably for chip sizes up to an edge dimension of 3 mm. However, only a small subset of available chips is included within this size limit. For example, memory chips are typically 10-20 mm on a side and microprocessor chips are typically 18 mm on a side or larger. For larger chip sizes an epoxy under-layer 26 is used, as shown in FIG. 2D. It fills the gap between the mated parts and binds them together. Unfortunately, the epoxy under-layer makes rework difficult, and rework is usually not attempted when this layer is present. The consequence of an inability to rework is that if one chip in an assembly is defective, the whole assembly must be rejected. Thus, efforts to produce known good die (KGD) with a very high confidence factor (yield) have been instituted. Despite these efforts, the practical limit on such assemblies has been around 8-10 chips, with yield hits on more complex assemblies creating unacceptable reject costs.

It is a goal of the current invention to create complex assemblies with up to 100 IC chips or more, all using flip chip attachment, while avoiding the cost impact of rejected assemblies if one or more parts prove defective. This provides motivation for the improved flip chip connector described in FIG. 3A-3E.

Figure 3A:
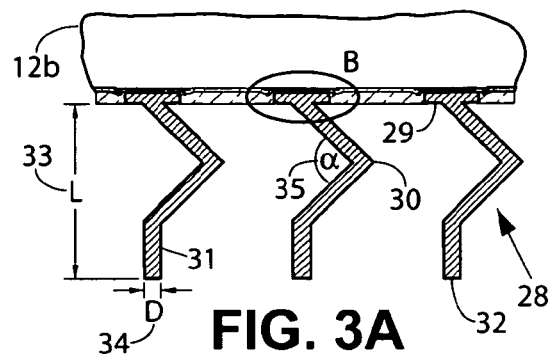
FIG. 3A-3E shows in cross-section a sequence of structures and process steps for assembling improved flip chip connectors of the current invention.
Figure 3B:
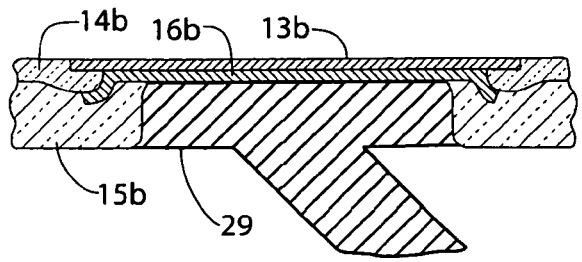

FIG. 3A shows a semiconductor substrate 12b having flip chip bumps in the form of conductive spring elements 28. Area B of FIG. 3A is shown expanded in FIG. 3B. Together, FIG. 3A and FIG. 3B show a semiconductor substrate 12b having input/output pads 13b showing through openings in a passivation layer 14b. An under bump metallization (UBM) 16b covers the pad area. A preferred sequence of under bump layers is a titanium adhesion layer followed by a seed layer of copper; a typical thickness for both layers is 50-80 nm. Using a process to be described herein, the preferred embodiment of the current invention includes conductive copper spring elements 28 that are built up from the copper seed layer of UBM 16b. Spring elements 28 preferably include a base pad 29 that provides a strong attachment to the input/output pad, a bend 30 that enables spring-like behavior, and an end or terminus 31 that is typically perpendicular to I/O pad 13b. Since copper is a ductile material, spring elements 28 can be readily deformed without breaking or cracking, with end 32 moving as required relative to base pad 29. To avoid cracking of the spring element due to fatigue caused by multiple bending cycles, copper deformation should be limited to its elastic range only. If lateral displacements of the ends 32 of spring elements 28 can occur at low applied force, this will have the effect of relaxing shear stresses in the horizontal plane. The deflection force depends on the flexibility of the spring element. For lateral deflections in the horizontal plane, flexibility of spring element 28 depends on its length L, 33 and its diameter D, 34. A suitable range for length is 50-250 μm and a suitable range for diameter is 5-50 μm. The preferred length and diameter are 100 µm and 10 µm respectively; the 100 µm length dimension was used in the discussion relating to FIG. 1. In addition, the length 33 of spring element 28 will change when bend angle α, 35 changes, and this can be used to relax stress in the vertical direction, normal to I/O pad 13b. Vertical flexibility of the spring element depends on the size and angle of the "sideways V" portion of the spring element and on the diameter: bigger sizes, smaller angles and smaller diameters will increase flexibility. The discussion relating to FIG. 1 established a typical vertical displacement (ΔY) at around 6 µm, and the relative dimensions shown for spring element 28 will accomplish this at low applied force. Since pads 13b are typically closely spaced compared with the dimension over which the stress is applied (caused by CTE differences or thermal hot spots for example), the spring elements provide a fine-grained compliant structure for relieving stresses applied over relatively larger areas. By providing stress relief using the flexural behavior of the spring elements, an epoxy under layer is avoided and a serious impediment to rework is eliminated. For IC chips having an edge dimension significantly larger than 20 mm or operating over unusually wide temperature ranges, spring elements 28 may need to be longer to accommodate greater displacements at the interface.

Figure 3C:
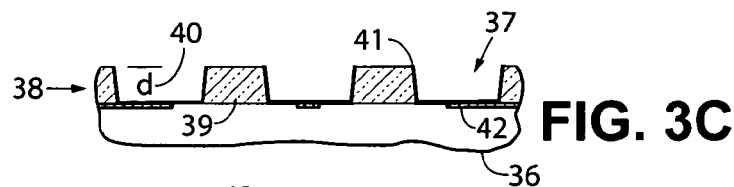

FIG. 3C shows a semiconductor substrate 36 having wells 37 that will be used to implement the second half (female side) of the improved flip chip connection of the current invention. The wells are fabricated in assembly layer 38 formed from dielectric material 39 such as BCB. The BCB is preferably photo-defined, by exposing with ultra-violet radiation through a mask. A suitable depth d, 40 for the wells is 10-30 µm with 15 µm preferred. Wells 37 have conductive walls 41 providing the functions of a UBM; the conductive walls also connect with traces such as 42 in substrate 36. The conductive walls are preferably formed from sputtered titanium/copper for adhesion, followed by 2-5 µm of electroplated nickel. The nickel provides a diffusion barrier and a solder-wettable surface.

Figure 3D:
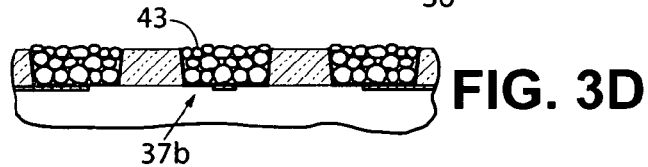

In FIG. 3D, a fine-grained solder paste 43 has been deposited in the wells, preferably using a squeegee to press the paste into the wells. A well filled with solder paste is labeled 37b. The solder paste is preferably lead-free to avoid environmental toxicity. For low temperature applications a preferred solder paste is 57Bi42Sn1Ag comprising 57% bismuth, 42% tin and 1% silver; this paste has a melting point of 140° C. and a typical peak reflow temperature of 175° C. If this low temperature solder is acceptable in the system design, considering all post-assembly processes and potential storage, transport, and operating environments, it has the advantage of reduced thermal stress on the assembled components when the solder is reflowed for permanent attachment or for rework, to be further described. For high temperature environments such as automotive applications, a higher melting point will be required. Preferred solder pastes for higher temperature applications include 96.5Sn3.5Ag with a melting point of 221° C., and 88Au12Ge with a melting point of 356° C. Each solder formulation requires careful analysis of the UBM sequence of layers, to avoid metallurgical problems such as brittle inter-metallic compounds.

Figure 3E:
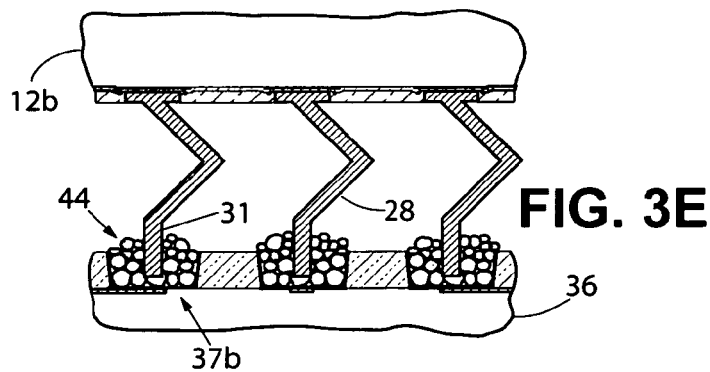

FIG. 3E shows the effect of aligning chip substrate 12b with substrate 36, and inserting the bumps (conductive spring elements 28) into the wells. A preferred alignment method employs split beam optics, achieving alignment accuracy as good as ±1 µm, as is known in the art. Insertion of the bumps in the wells is a gentle process because the solder paste is soft, the wells are deep, and the spring elements are flexible in the vertical direction; thus breakage of semiconductor parts can be avoided. This is particularly important for recent IC chips that employ fragile low-k dielectrics. As end section 31 of spring element 28 penetrates well filled with solder 37b, some solder material 44 is displaced upward as shown.

Figure 3F:
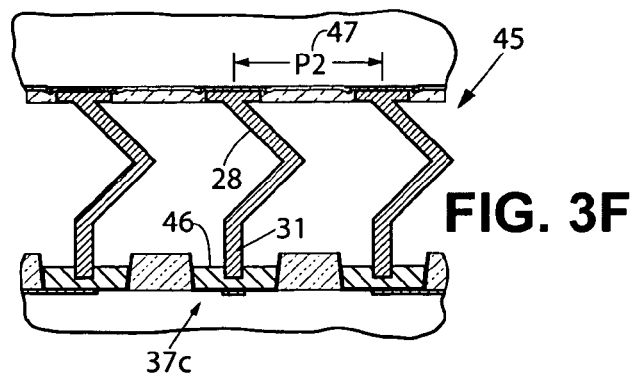

FIG. 3F shows completed flip chip attachments 45 of the current invention, including spring elements 28 inserted into wells filled with solder 37c, this time after heating to create reflowed solder 46. The volume of solder paste typically reduces to approximately one half during reflow. The melted solder solidifies around end section 31 of the spring structure, providing a strong mechanical attachment. Flip chip connector 45 has low-electrical resistance, small size compared with solder ball connectors, and low inductance because of the small size. The minimum pitch P2, 47 between connectors 45 is preferably around 80 µm, closer than achievable with solder ball connectors 24 of FIG. 2D. As previously discussed, connector 45 has a compliant structure that relieves mechanical stress and allows the elements it connects to remain flat, thus enabling arbitrarily high stacks of elements, while avoiding problems like bowed components and undesirable stresses in the connecting elements and their attachments. Additionally, good electrical and mechanical connection can be achieved over a range of insertion depths of spring elements 28 in wells filled with solder 37c. Using a preferred well depth of 15 µm, variations of around 5 µm in penetration depth are acceptable. A larger range of adjustability can be provided if necessary, using deeper wells. This vertical adjustability contrasts with the planarity problems associated with solder ball connections; lacking compliant elements the solder balls require a diameter accuracy of around ±1 µm to achieve adequate planarity for reliable connections.

For temporary connections, it may be desirable to fill wells 37 with a liquid metal such as an alloy of gallium. The temporary connection may be used to test or burn in semiconductor elements to establish known good die; the die will preferably include a bump at each input/output pad, and the bumps will be inserted into the wells to establish the temporary connection. The bump may be a spring element like 28 or it may be some other form of bump such as solder bump 17 of FIG. 2A.

A critical attribute of flip chip connectors 45 is the ability to rework an attachment if the assembled component proves to be defective; it is this capability that enables 100% assembly yield for subsystems of the current invention. Rework of an assembly employing flip chip connectors 45 will now be described. Typically the larger substrate contains the wells. It is pre-heated on a hot plate to a temperature below the solder melting point. Hot gas is directed at the defective chip (and not at its neighbors) using a shrouded source of hot inert gas. When the solder melts in the wells, the bumps are withdrawn and the defective component is discarded. Preferably the remaining solder in the wells is sucked out in one quick operation. The wells are refilled with fresh solder paste, using a miniature squeegee if space is limited. After inspection and any necessary touch-up, a replacement part is assembled. There are no fragile leads on the substrate that can be damaged during this rework operation, and it can be performed as many times as necessary.

Figure 4A:
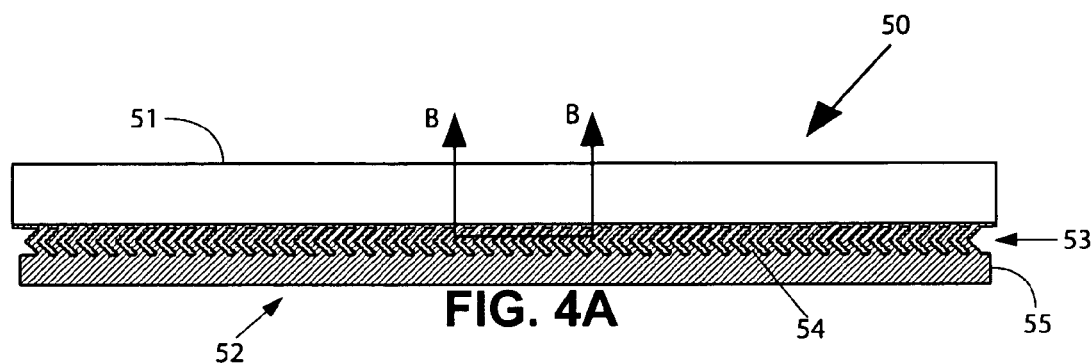
FIG. 4A is a cross-sectional side view of an IC chip with an integrated interface adaptor.

FIG. 4A shows an integrated assembly 50 including a semiconductor element 51 and an interface adaptor 52. Semiconductor element 51 may be an IC chip or a semiconductor integration platform that replaces a printed wiring board (PWB) for integrating multiple IC chips, as will be further described. Interface adaptor 52 includes an array 53 of flexible fingers 54 attached to a base 55. Adaptor 52 provides mechanical support for the semiconductor element, it relieves stress at the interface (especially if both the heat sink and the interface adaptor are composed of a like material such as copper), and it provides a low impedance thermal path for cooling the semiconductor element using a heat sink, to be further described.

Figure 4B:
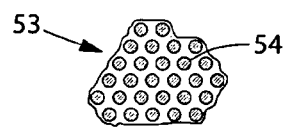
FIG. 4B illustrates section BB of FIG. 4A, showing individual fingers of the interface adaptor.

FIG. 4B shows a fragmentary cross-section of array 53 of fingers 54, corresponding to section BB of FIG. 4A. Fingers 54 are individually formed and have gaps between them that may be filled with air or another medium; the fill material effectively increases the thermal conductivity of the finger section of the interface adaptor. The fill material may be a liquid metal for example, such as a gallium alloy, providing convective as well as conductive cooling in the spaces between the fingers. The fingers 54 connect between the back side of IC chip 51 and base 55 of the interface adaptor. Preferably each finger has a bend in it, so that it behaves like a spring that can relieve stresses in the plane of the substrate as well as normal to this plane. Because copper is a much better heat conductor than thermal grease, interface adaptor 52 can provide a lower impedance thermal interface to a heat spreader or heat sink. It also reduces labor content in assembly, and eliminates the mess commonly experienced during application of the grease.

Figure 4C:
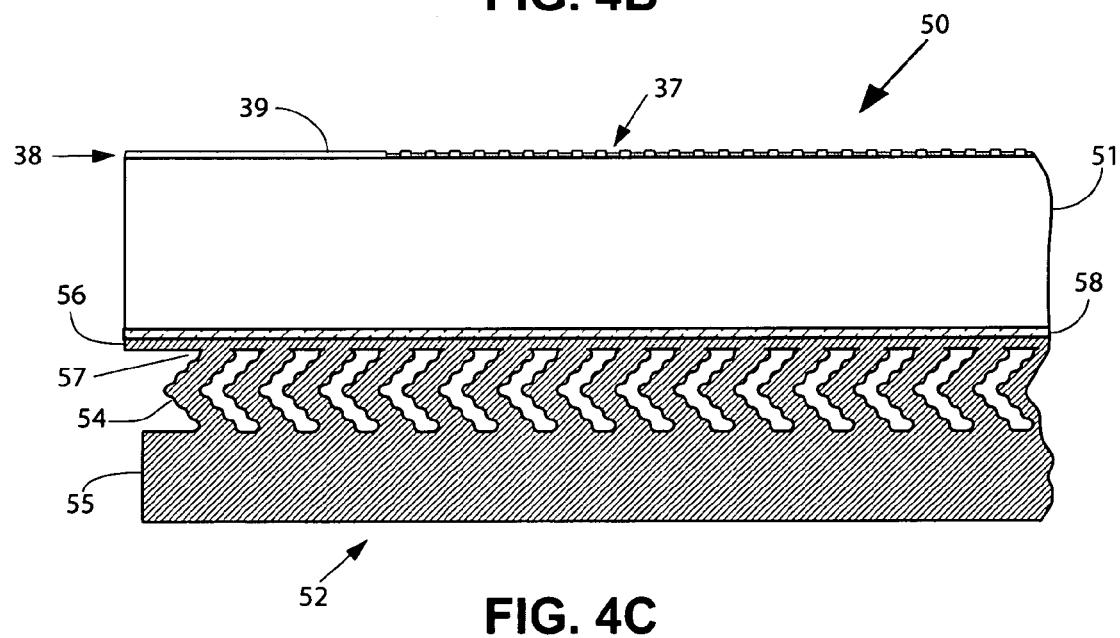
FIG. 4C is an expanded cross-sectional view of IC chip and interface adaptor.

FIG. 4C is an expanded view of an end of integrated assembly 50. Semiconductor element 51 includes an assembly layer 38 having wells 37 formed in dielectric material 39, as described in reference to FIG. 3C. The wells will be filled with solder paste and used to attach IC components in the manner described in FIG. 3. Additional details of interface adaptor 52 are also shown. Flexible fingers 54 are preferably built up (electroformed) from copper seed layer 56, preferably with no junction of dissimilar material at interface 57; such a junction would typically raise the thermal impedance of the joint. The fingers are rejoined at base layer 55 which provides mechanical support, plus a convenient surface for bonding to a heat sink. Seed layer 56 is thin enough that it does not substantially impede expansion or contraction of semiconductor substrate 51; a preferred thickness for the copper seed layer is 50-80 nm. A layer 58 of dielectric material may be used to provide electrical isolation between semiconductor element 51 and a heat sink (not shown) that may be attached to interface adaptor 52. The preferred material for layer 58 is chemical vapor deposited (CVD) silicon oxy nitride, having a thickness of around 1 μm. This will provide electrical isolation while only slightly degrading the thermal conduction between semiconductor element 51 and an attached heat sink. Fingers 54 preferably have a bend in them, just like spring elements 28 of FIG. 3A, for relieving stress and also for providing shock absorption in the direction normal to the mating surfaces. A detailed process sequence for fabricating interface adaptor 52 is described in co-pending U.S. patent application Ser. No. 10/997,566.

Figure 5A:
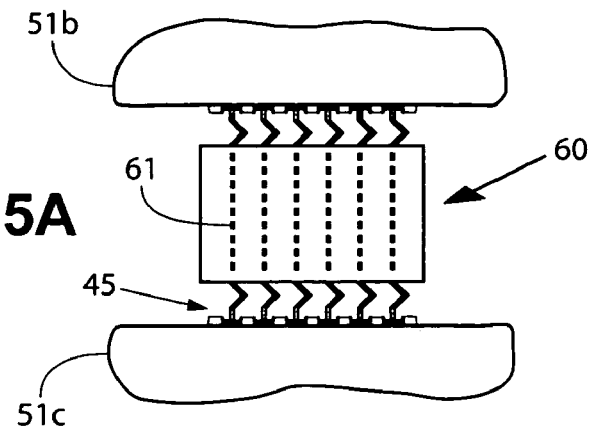
FIG. 5A is a schematic view of an input/output plug of the current invention.

FIG. 5A illustrates I/O plug 60 of the current invention, used for transferring signals and power from one semiconductor substrate to another. In the figure it connects between semiconductor elements 51b and 51c. Preferably, connectors 45 are used at both ends of plug 100; they are described in reference to FIG. 3F.

FIG. 5B illustrates an expanded view of a fragment of I/O plug 60 formed from silicon wafer 62 having an array of polysilicon feedthroughs 61. The preferred polysilicon structure follows process development at Stanford University, California and at the University of Florida by Eugene M. Chow et al. The feedthroughs are preferably organized in an array, with centers on a regular grid. Plasma anisotropic etching is used to etch 20 μm diameter holes having essentially vertical sidewalls in silicon wafer 62 that is preferably 400 μm thick. A first layer of silicon oxide 63 is formed to provide isolation from substrate 62. A layer of polysilicon 64 is deposited to form a conductive screen for the feedthrough signals. A second layer of oxide 65 is formed to provide isolation between screen 64 and signal feedthroughs 66, also formed from polysilicon. A metal trace 67 is contacted to the polysilicon screen for making a connection to ground. An under bump metallization 16b is formed at the ends of each polysilicon feedthrough, including a copper seed layer that is electroplated using methods to be described herein for forming copper spring elements 28 at each end. The pitch P3, 68 between spring elements is preferably around 80 μm. I/O plug 60 is a passive circuit that is simply produced with a small number of masking steps, when compared with around 26 masking steps required to fabricate modern CMOS wafers. It can be fabricated inexpensively, potentially on older fab lines. A family of different sized I/O plugs can be provided on each wafer, with adequate space allocated for dicing lanes. The connect density can be high; a 10×10 array providing 100 interconnects has an edge dimension of less than 1 mm in the preferred embodiment. This means that I/O plugs 60 can provide substantial connectivity for signals and power distribution using chips of small area; they are typically provided at strategic locations on a semiconductor integration platform, as will be further described. In contrast with routing problems commonly encountered with PWBs when close pad pitches are used, trace routing on the semiconductor platform can be more closely spaced, providing a high wiring density and typically avoiding such problems. Feedthroughs 61 have a typical series resistance of 10-14 Ω, and a typical capacitance of less than one picofarad, enabling propagation of high speed signals through the I/O plug. Typically, power connections will employ a number of feedthroughs 61 connected in parallel.

Figure 5D:
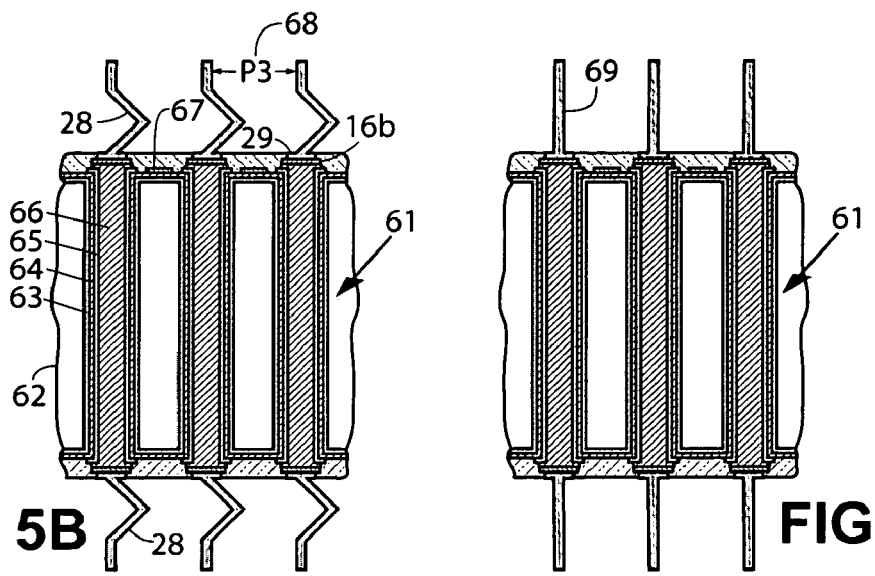
FIG. 5D shows in cross-section the use of solder bumps as alternative terminals of an input/output plug.
Figure 5D:
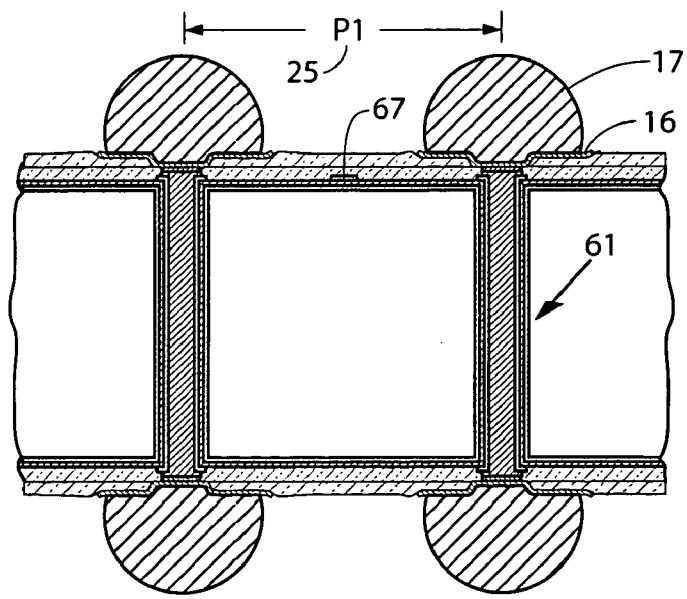

FIGS. 5C and 5D illustrate different types of terminals for an I/O plug, or for any semiconductor element employing flip chip connectors of the current invention. The current invention includes any kind of metallic bump terminal for implementing the male side of the improved flip chip connector; wells filled with conductive material are used on the female side. Alternative forms of bumps include conductive spring elements 28 of FIG. 5B, straight wire-like elements or mesas 69 of FIG. 5C, and solder bumps 17 of FIG. 5D. Solder bumps 17 are formed on UBM 16, and have a minimum pitch P1, 25 of around 150-200 μm, as described in reference to FIG. 2D.

Figure 6A:
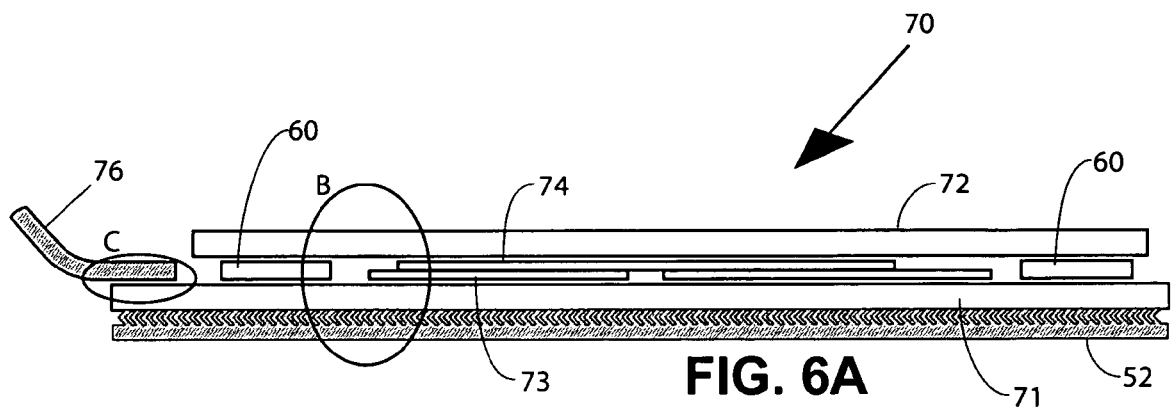
FIG. 6A is a cross-sectional view of a repairable three-dimensional semiconductor subsystem of the current invention.

FIG. 6A is a side view of a repairable and closely packed electronic subsystem 70, as a first preferred embodiment of the current invention. Subsystem 70 includes semiconductor integration platforms 71 and 72, stacked IC chips such as 73 and 74, and I/O plugs 60 as described in FIG. 5A-5D. An interface adaptor 52 is shown, and a cable 76 for communicating between subsystem 70 and other systems or subsystems. All of the semiconductor elements and the cable preferably interconnect using preferred flip chip connectors like 45 of FIG. 3F, which makes the chips and cable re-workable and the subsystem repairable. The preferred thickness of I/O plug 60 is approximately twice the thickness of IC chips 73 and 74, so that stacking can be performed without air gaps between the elements. The assembled height of flip chip connectors 45 is approximately 115 μm in the preferred embodiment. This height can vary by approximately 5 μm, depending on the depth of penetration of the spring elements into the wells, providing vertical compliance as previously discussed. A greater tolerance can be provided by building deeper wells. Expansion or contraction of the spring elements provides additional height adjustability. This vertical compliance (adjustability) is critical to manufacturability of the stacked structure because thinning and planarization operations on the semiconductor elements are generally imperfect, so a "forgiving" assembly structure is necessary for ease of assembly and high yield. For improved packing density of semiconductor subsystems of the present invention, semiconductor elements like 73 and 74 are preferably thinned to around 100 μm. Thinner elements may also be used, but they will typically be more difficult to handle.

Whenever connections are required between opposing substrates having dissimilar expansion characteristics, the capability of the flip chip connectors to relieve shear stress is desirable, as discussed in relation to FIG. 1. However, in subsystem 70 all of the semiconductor elements may have similar expansion characteristics; for example they may all employ silicon substrates. This special situation would render the shear stress problem moot; the requirement for the connectors to absorb ΔX displacements would be reduced or eliminated. However, vertical compliance is still critical for ease of assembly and low stress in stacked structures like subsystem 70, and flip chip connector 45 remains the preferred connector type. Also, by standardizing on terminals employing the preferred spring elements, the semiconductor elements can be used effectively in a wide range of packages and multi-chip assemblies, directed at multiple diverse applications.

Figure 6B:
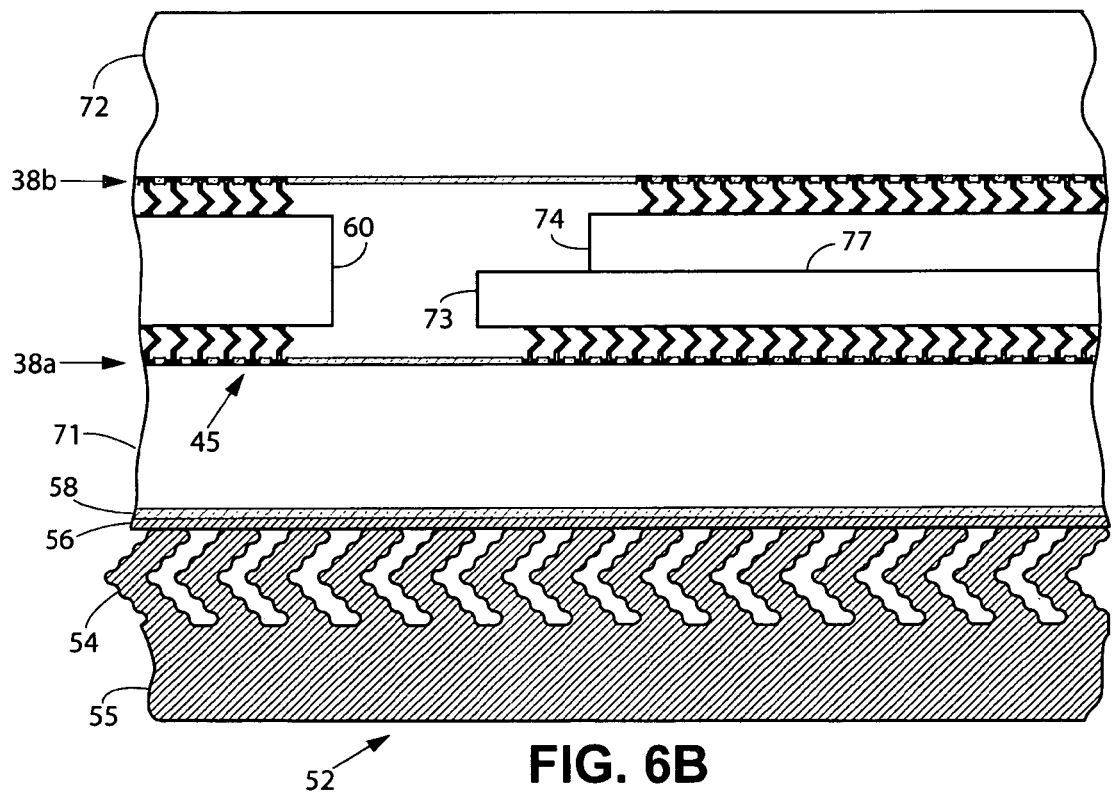
FIG. 6B is an expanded cross-sectional view of area B of FIG. 6A, showing details of stacked semiconductor elements.

FIG. 6B is an expanded view of area B of FIG. 6A, showing stacking details, assembly layers 38a and 38b, and arrays of flip chip connectors 45. IC chips 73 and 74 are shown, along with I/O plug 60. Semiconductor integration platform 71 is shown with attached interface adaptor 52, including base layer 55 and flexible fingers 54. In the vertical direction there are no air gaps between semiconductor elements that would cause thermal barriers; this is accomplished using the vertical latitude (adjustability) in the assembled form of the improved flip chip connectors. When the top assembly is connected with the bottom assembly as will be further described, the parts come together until they meet at surfaces such as 77, and the thickness of the various semiconductor elements is controlled so that penetration of the spring elements into the wells is within an acceptable range, achieved at assembly layers 38a and 38b.

Subsystem 70 can be effectively cooled because silicon is an excellent thermal conductor, gaps between elements are eliminated, the flip chip connectors are highly conductive, and interface adaptor 52 provides a low impedance thermal connection between integration platform 71 and an attached heat sink (not shown). For more complex subsystems, the stack can be extended in area and/or in height, as will be further described in reference to FIG. 7A-7C.

Since the various semiconductor elements like 71-74 are breakable if subjected to shock or bending forces in a system application, it is desirable to provide a relatively strong base for mechanical support. Preferably the support will also enable effective cooling. This can be accomplished using interface adaptor 52 as shown in FIG. 6B; adaptor 52 is preferably bonded to a mechanically rugged heat sink or enclosure as will be further described in FIG. 7A.

A preferred order of assembly for subsystem 70 will now be described. Semiconductor integration platform 71 with integrated interface adaptor 52 provides the base element. The first layer of IC chips such as 73 is attached, as well as I/O plugs 60. A second assembly is produced using integration platform 72 as a base, and attaching IC chips such as 74. With platform 72 on the bottom, platform 71 with attached components is aligned and attached at the exposed terminals of the I/O plugs. Finally, with platform 71 on the bottom, cable 76 is aligned and attached, again using the improved flip chip connectors. The traces on the other end of cable 76 may be fanned out for convenient attachment to testers or other system components, using flip chip connectors 45 or some other type of connector.

Figure 6C:
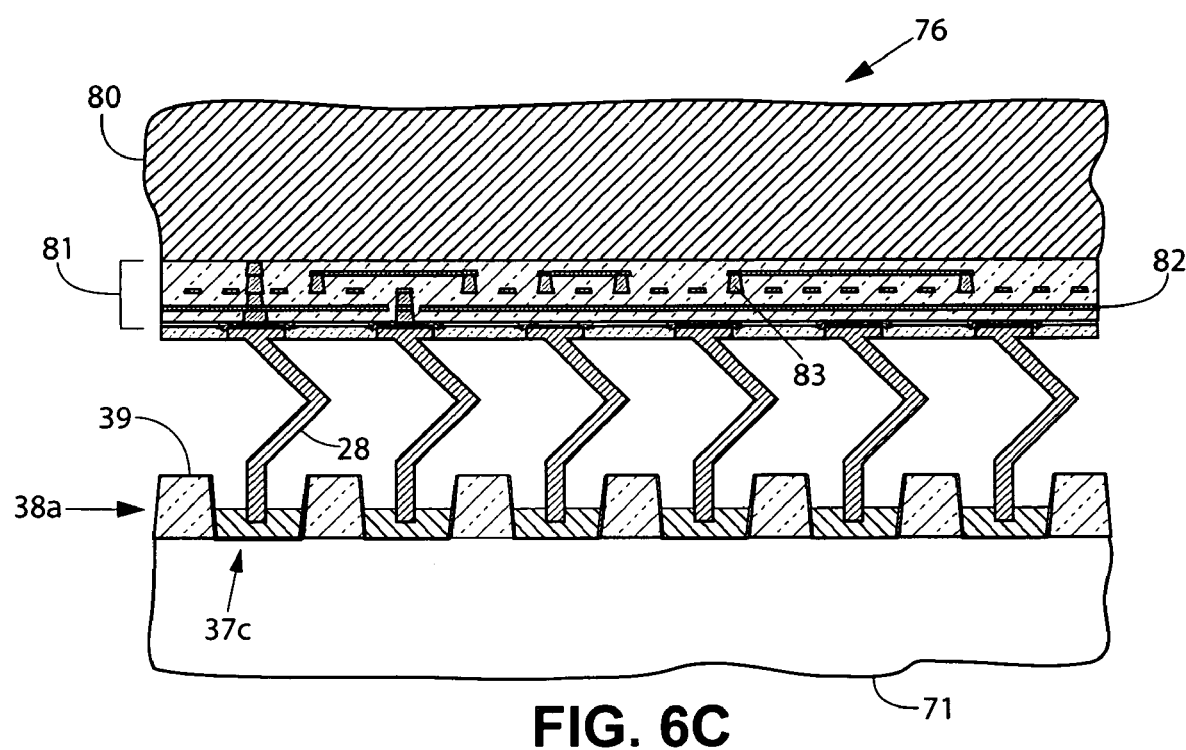
FIG. 6C is an expanded cross-sectional view of area C of FIG. 6A, showing details of a high-performance cable using the same improved flip chip connectors for connecting the cable to a semiconductor integration platform.

FIG. 6C is an expanded view of area C of FIG. 6A, showing details of cable 76 and its flip chip attachment. Integration platform 71 is shown with assembly layer 38a including wells filled with solder 37c. The preferred process for building interconnection circuit 81 of cable 76 is a dual damascene copper process, including a ground plane 82 and two planes of orthogonal signal traces as shown. Microvias 83 are used to connect between layers, as is known in the art. Copper substrate 80 is preferably connected to ground and acts as a reference plane. Preferably interconnection circuits 81 are arranged in the form of offset coplanar striplines. These are transmission lines having a typical controlled impedance of 100 Ω for differential pairs, and 50 Ω for singled-ended signals. Use of these striplines in combination with the improved flip chip connectors is projected to provide signaling rates up to 10 Gpbs. Cables such as 76 are preferably fabricated on 300 mm square copper wafers using full-field proximity mask aligners.

Figure 7A:
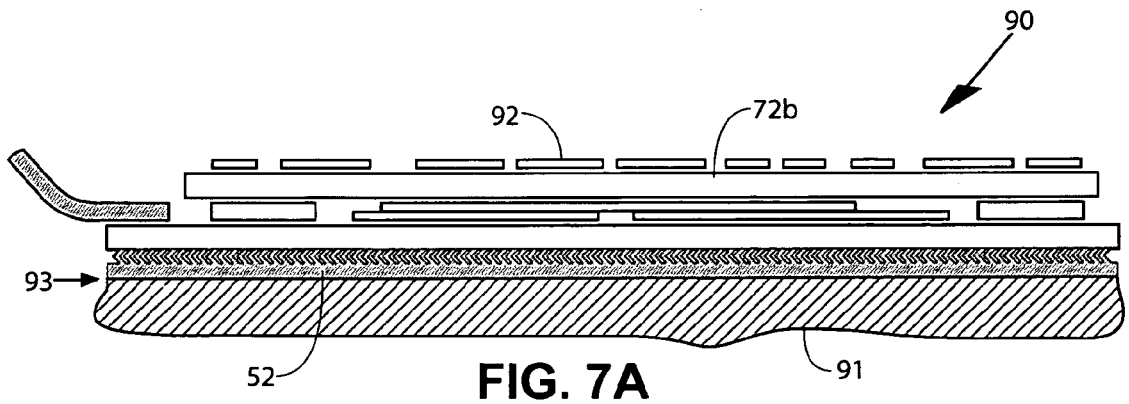
FIG. 7A-7C shows in cross-section alternative preferred embodiments of repairable subsystems of the current invention.

FIG. 7A illustrates a second preferred embodiment 90 of a repairable electronic subsystem of the current invention. In addition to the elements of subsystem 70 of FIG. 6A, subsystem 90 includes a heat sink 91 attached using interface adaptor 52. Attachment at interface 93 may be accomplished using a thin film of thermally conductive epoxy for example. Reactive foils may also be used to melt a sheet of solder at the interface, thereby bonding the parts together with low thermal impedance. Heat sink 91 may be an enclosure that also serves as a heat sink. Preferably heat sink or enclosure 91 provides strong mechanical support as well as heat extraction. Additional IC chips such as 92 are attached to the top side of integration platform 72b, which now includes through wafer connections like 61 of FIGS. 5A and 5B, in order to connect between semiconductor elements on its top and bottom sides.

Figure 7B:
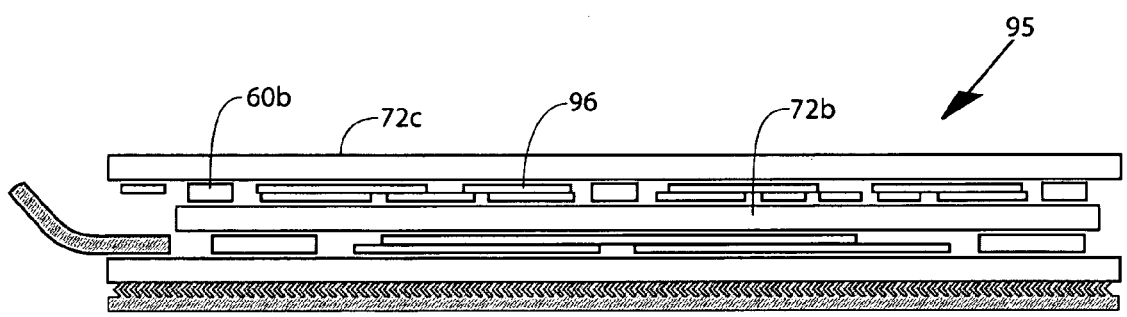

FIG. 7B illustrates a third preferred embodiment 95 of a repairable electronic subsystem of the present invention. Subsystem 95 includes another semiconductor integration platform 72c, connected using I/O plugs 60b to platform 72b of FIG. 7A. This provides mechanical and electrical support for another layer of IC chips such as 96 to be attached to the under side of platform 72c.

Figure 7C:
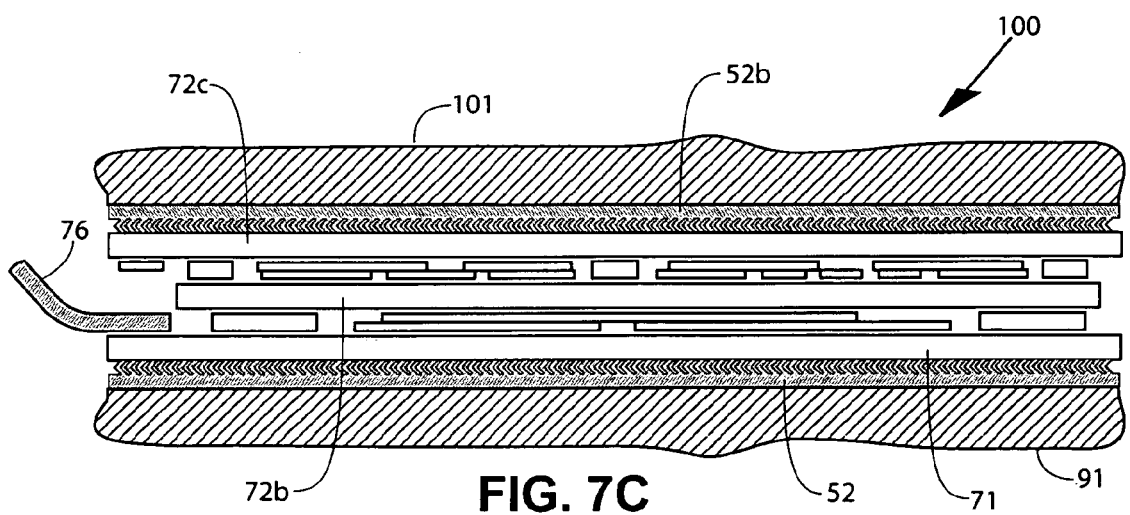

FIG. 7C illustrates a fourth preferred embodiment 100 of a repairable electronic subsystem of the present invention. Subsystem 100 includes semiconductor integration platforms 71, 72b, and 72c each having attached semiconductor elements as shown. Unlike most electronic subsystems employing stacked semiconductor elements, complexity is not limited by yield issues but rather by thermal considerations. Accordingly, subsystem 100 includes interface adaptors at both top and bottom, 52b and 52, attached to heat sinks 101 and 91 as shown. This arrangement provides a thermal and electrical architecture that may support supercomputers of the future, including sets of parallel planes of heat sinks such as 101 and 91, with dense assemblies of semiconductor elements sandwiched in between as shown, connected using cables such as 76.

Figure 8:
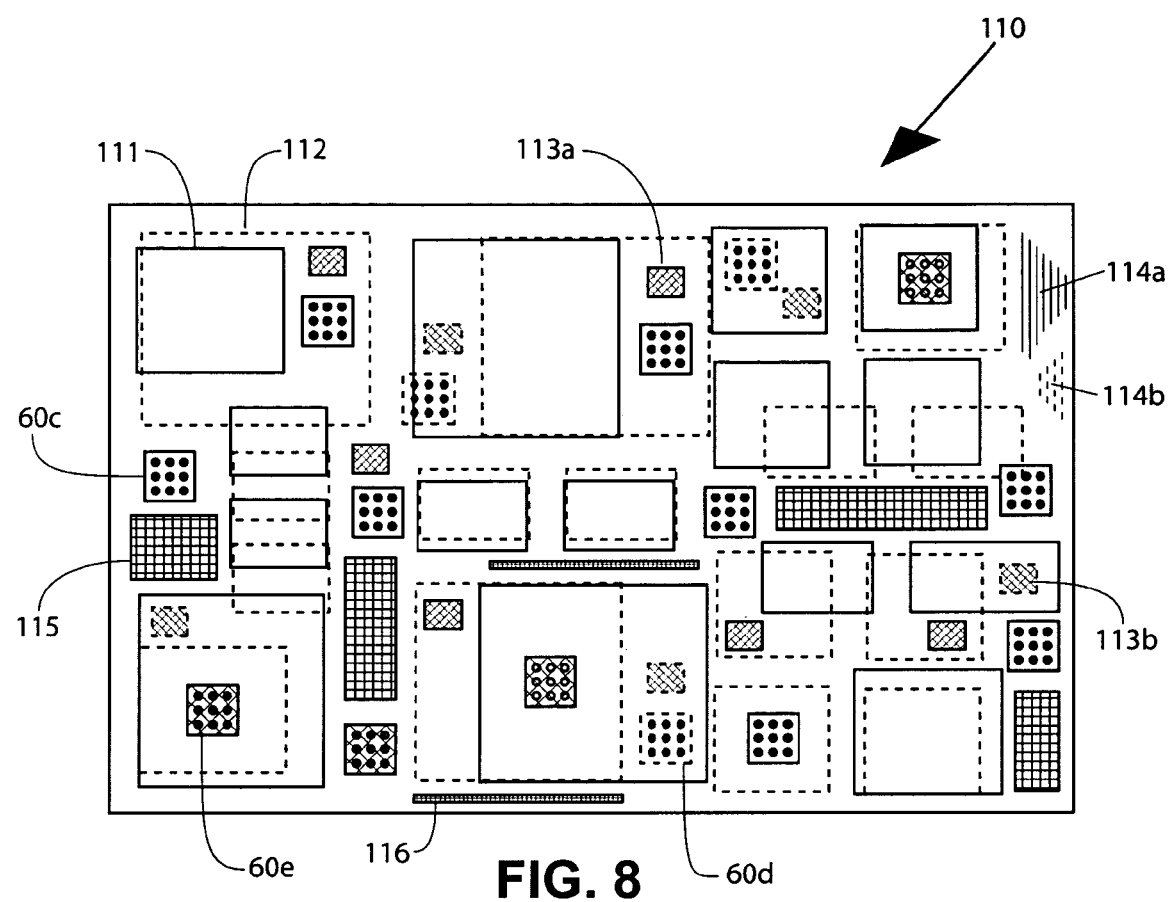
FIG. 8 is a schematic X-ray view of a semiconductor integration platform of the current invention, showing multiple attached components and embedded circuit types that may be used.

FIG. 8 is a schematic view of a semiconductor integration platform 110 of the current invention. Integration platform 110 incorporates examples of all of the circuit structures required to produce platforms 71, 72, 72b, and 72c previously discussed in reference to FIGS. 6 and 7. Integration platform 110 includes top-side mounted IC chips 111 and bottom-side mounted chips 112. It includes three varieties of input/output plugs: a top-side mounted plug 60c, a bottom-side mounted plug 60d, and an embedded plug 60e. Embedded plug 60e can provide an array of direct connections between a top-side mounted IC chip and a bottom-side mounted IC chip, using through wafer connections like 61 of FIG. 5B-5C. This is achievable because the process for creating the polysilicon feedthroughs is "process compatible", as previously discussed. Integration platform 110 also includes attached semiconductor elements in the form of power distribution chips at the top side, 113*a* and at the bottom-side, 113*b*. The power distribution functions may also be implemented directly in the semiconductor substrate of platform 110. Platform 110 includes multi-layer interconnection circuits for wiring between all of the embedded and attached components, including top-side interconnection circuits 114*a* and bottom-side interconnection circuits 114*b*. Areas containing active circuits 115 and passive circuits 116 may be included. Passive circuits may include termination resistors for transmission lines and embedded bypass capacitors, as examples. Although platform 110 will typically be larger than most IC chips, it may yield well because it may include either none or a relatively small number of embedded transistors (active circuits). Platform 110 may also be fabricated using non state-of-the-art processes or may be processed on older fabrication lines for lower cost, since all of the high-performing functions can be implemented as discrete semiconductor elements. The attached semiconductor elements may include digital circuits, analog circuits, radio frequency circuits and optical circuits, with each type of circuit fabricated on the most suitable semiconductor substrate. Since the preferred flip chip connectors are equally applicable to all types of semiconductor substrates, the resulting subsystem remains repairable, and each of the semiconductor elements can be implemented as a plug-in device, to be tested and replaced if necessary. This method can enable 100% assembly yield, even for complex subsystems containing 100 IC chips or more. As part of the assembly strategy for a subsystem, each integration platform with its attached components is preferably verified as an independent unit before attaching to another integration platform, thus limiting the amount of disassembly (rework) that may be required.

Since the semiconductor elements may include optical devices, optical data links can be included between pairs of semiconductor elements containing the necessary emitters and receivers. Improved flip chip connectors of the current invention can be used to achieve good optical alignment. An approximate alignment is achievable using the inherent precision of the preferred bump/well connectors. An optimized alignment can be accomplished by maximizing a link performance measure such as signal-to-noise ratio (SNR) while the solder is molten; when the solder cools and sets the optimized link is fixed in place.

Every useful electronic subsystem requires the following elements: power, functional capabilities (typically embedded in IC chips), connectivity, cooling, and mechanical support. For the subsystem to be cost effective, testability and repairability are also required. The subsystems described herein include all of these elements, while eliminating conventional packages and PWBs. Additional components like integration platforms and I/O plugs are required, but they may be produced inexpensively and they may also offer a standardized and quick way to integrate complex subsystems. Some of the elements are multi-purpose; for example interface adaptor 52 provides mechanical support, stress relief, and thermal conduction in a single monolithic element. The stacked semiconductor architectures described herein achieve close to the maximum functional density available in wafer-to-wafer bonded systems, while still providing testability and repairability. Connectivity, cooling, and mechanical support are all provided using wafer level fabrication processes, an example of which will be detailed in reference to FIG. 9A-9X. Extensibility in three dimensions can be accomplished in a straight forward manner, while still retaining testability and repairability. It is suggested that these subsystems are potentially the most cost effective solution for any subsystem requiring the given set of functions. In addition the subsystems will be smaller and lighter than any known packaging solution, save wafer to wafer bonded systems using wafer thicknesses of only a few microns.

Figure 9A:
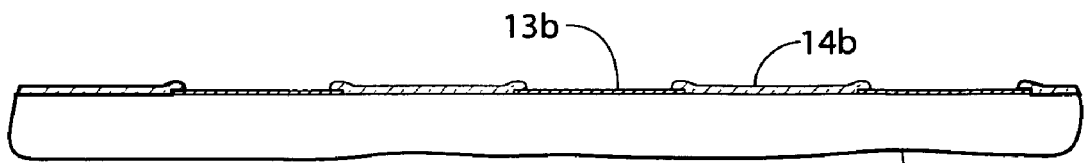
FIG. 9A-9X illustrates in cross-section a series of structures and process steps for fabricating improved flip chip connectors of the current invention, using wafer level processes.
Figure 9B:
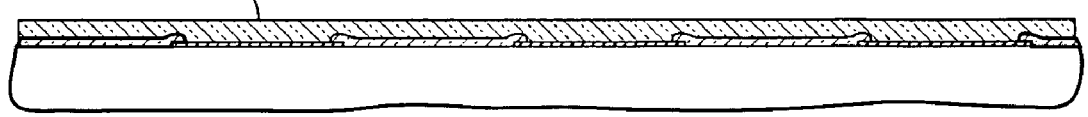
Figure 9C:
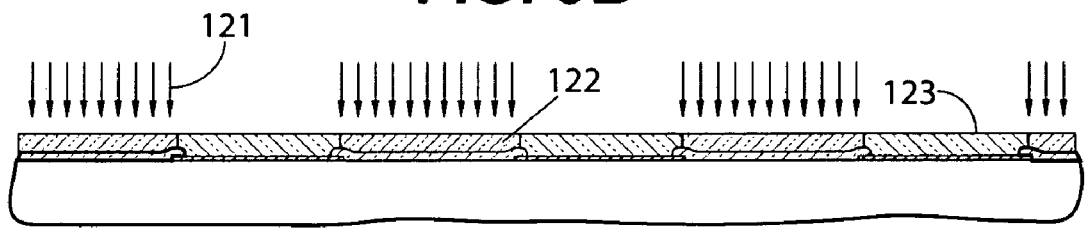
Figure 9D:
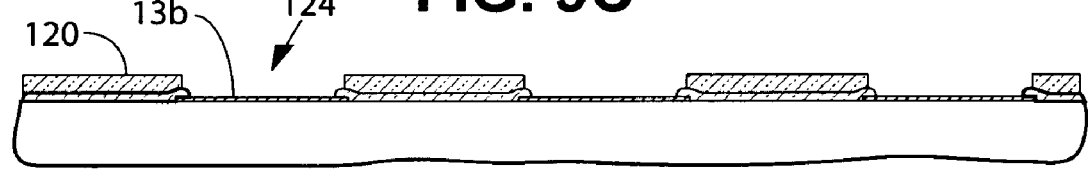
Figure 9E:
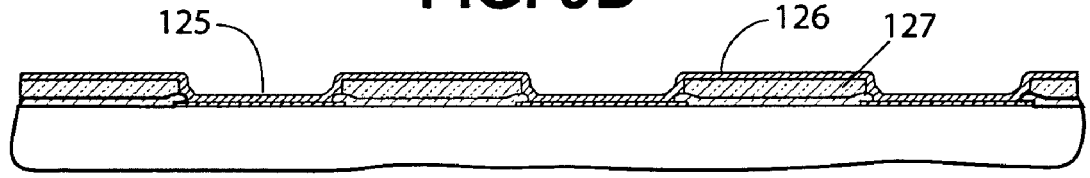
Figure 9F:
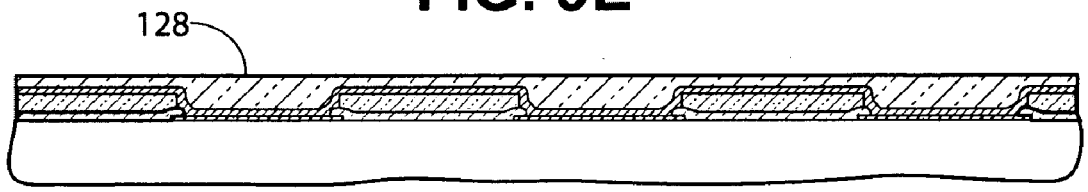
Figure 9G:
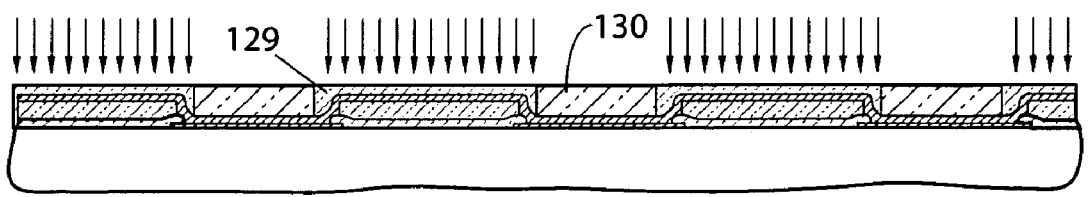
Figure 9H:
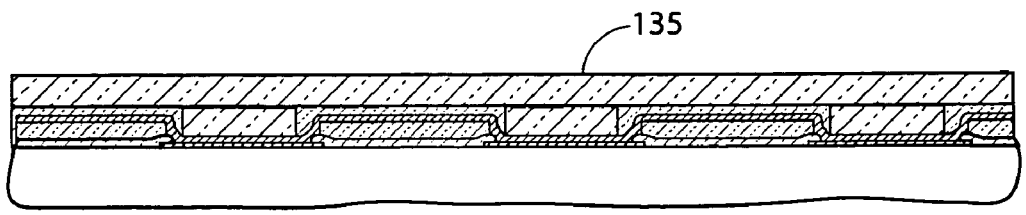
Figure 9I:
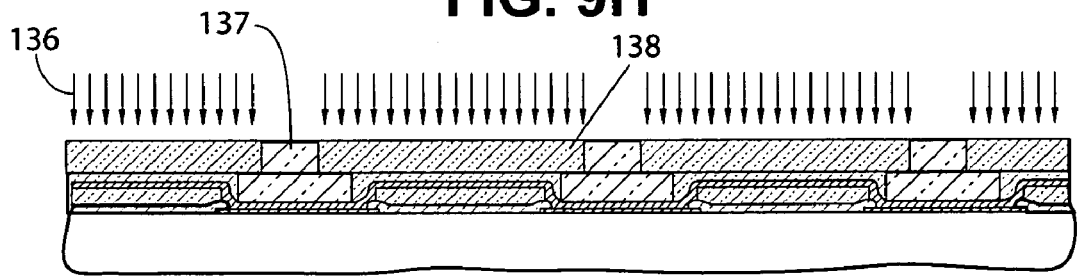
Figure 9J:
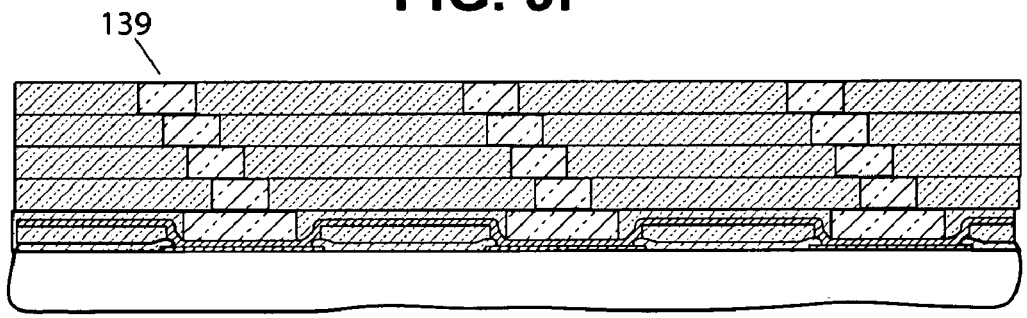
Figure 9K:
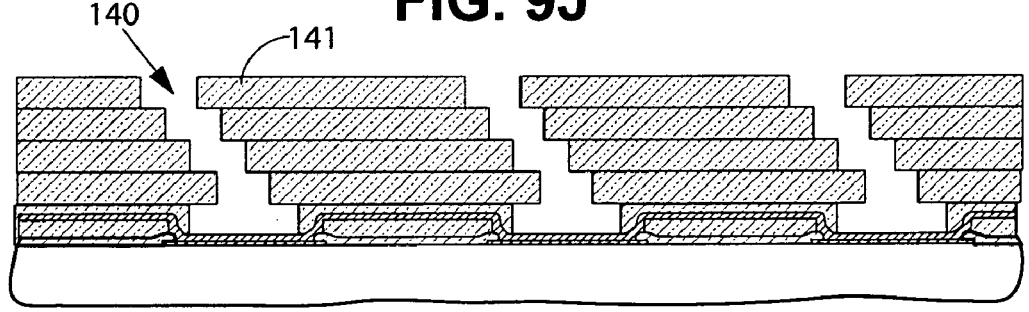
Figure 9L:
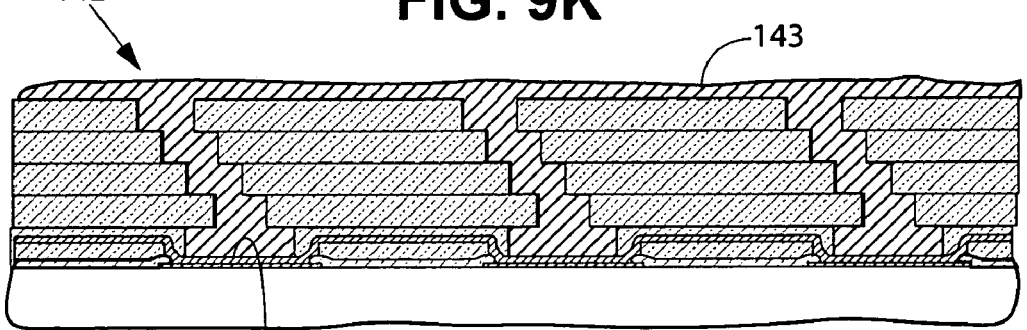
Figure 9M:
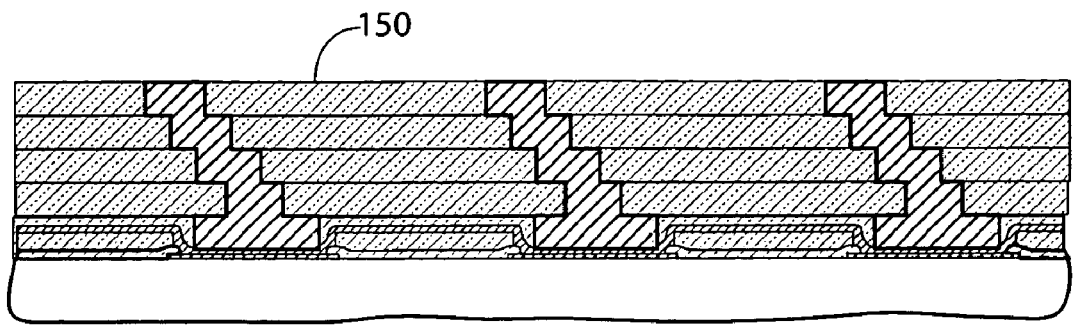
Figure 9N:
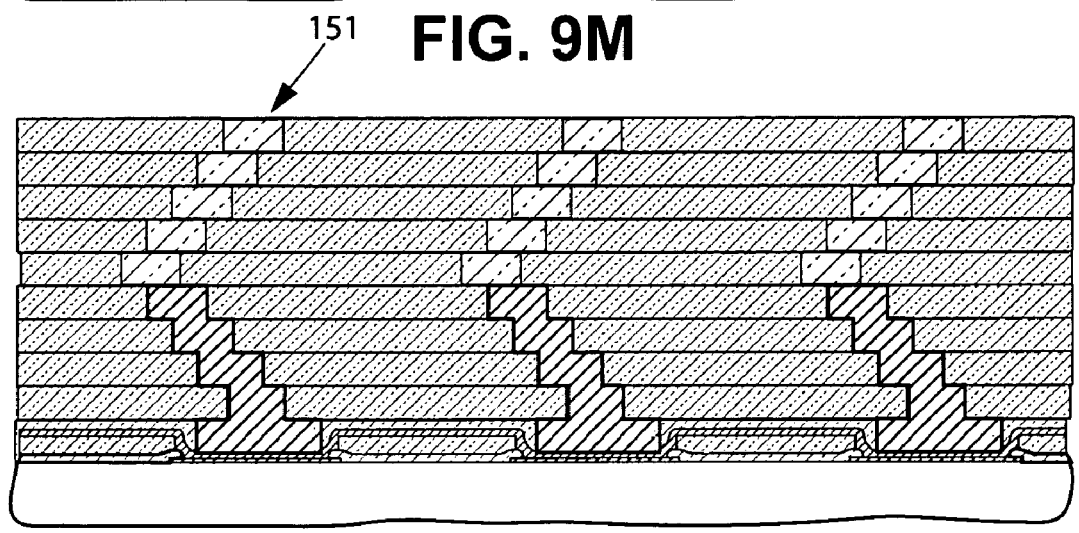
Figure 9O:
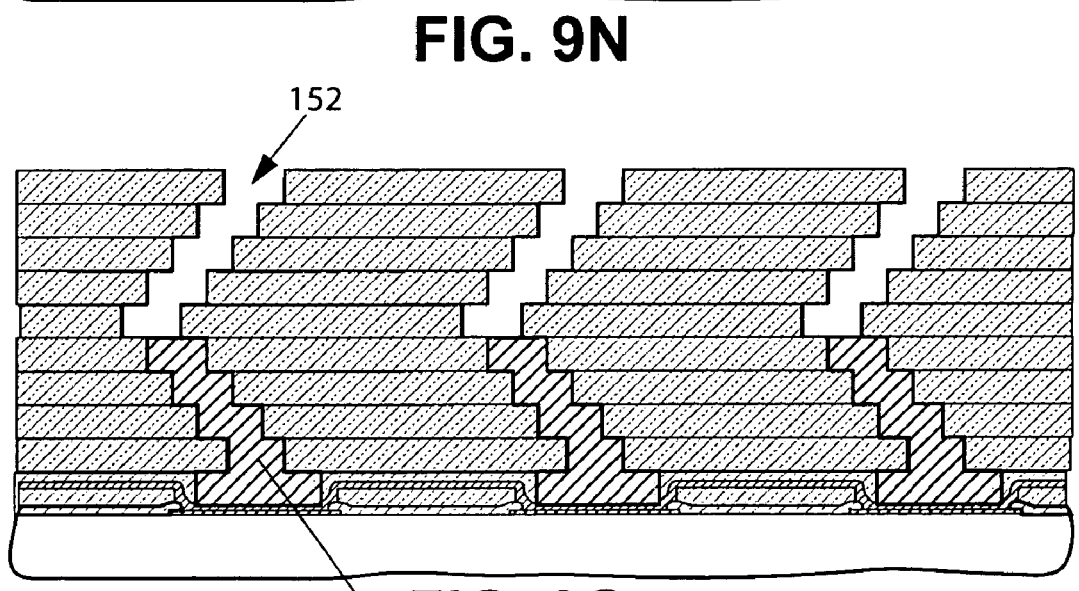
Figure 9P:
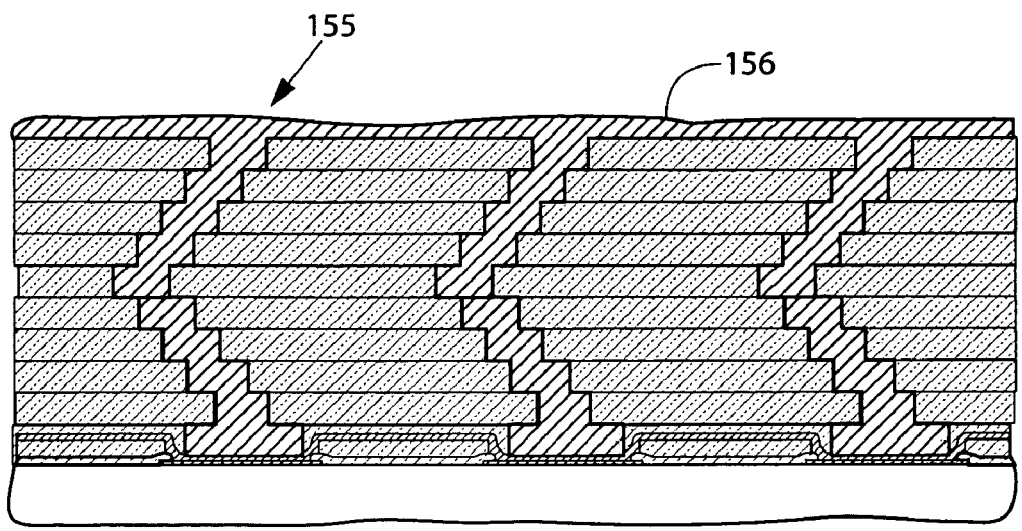
Figure 9Q:
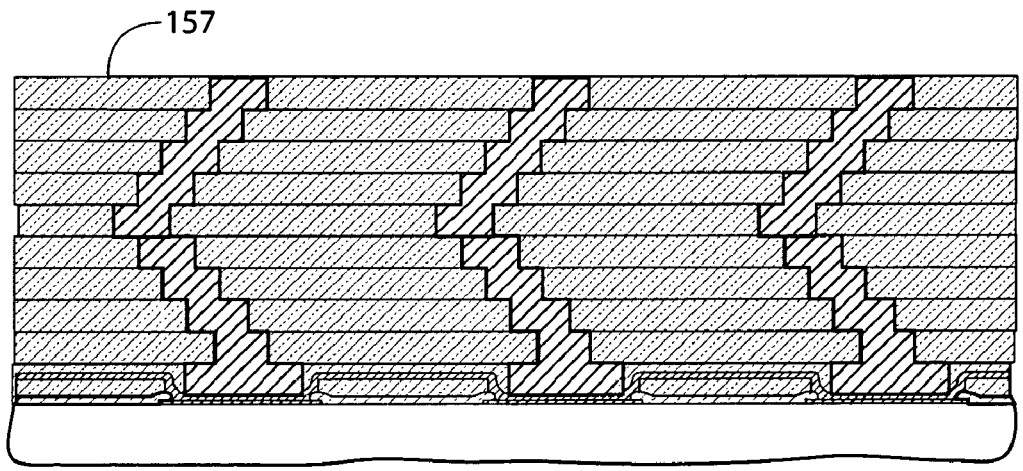
Figure 9R:
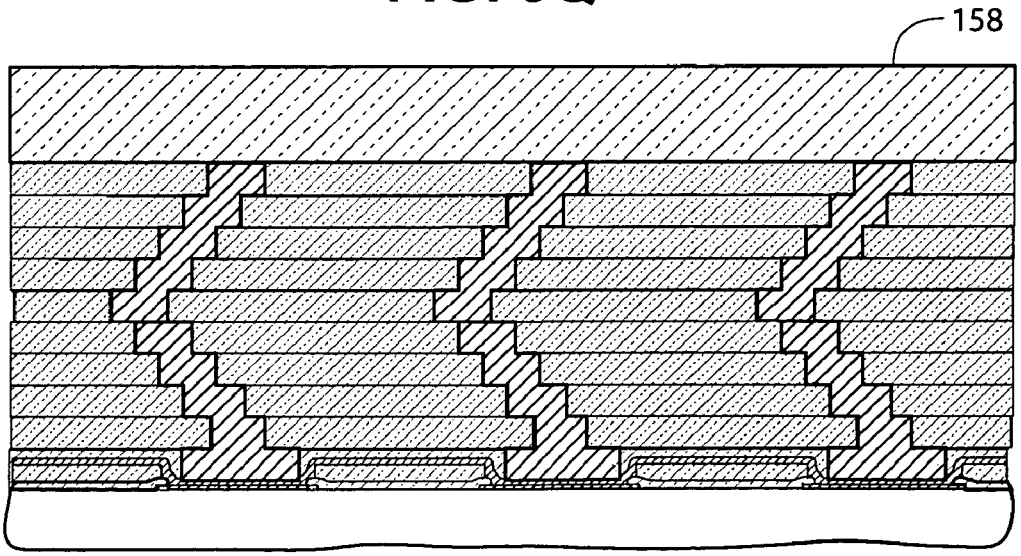
Figure 9S:
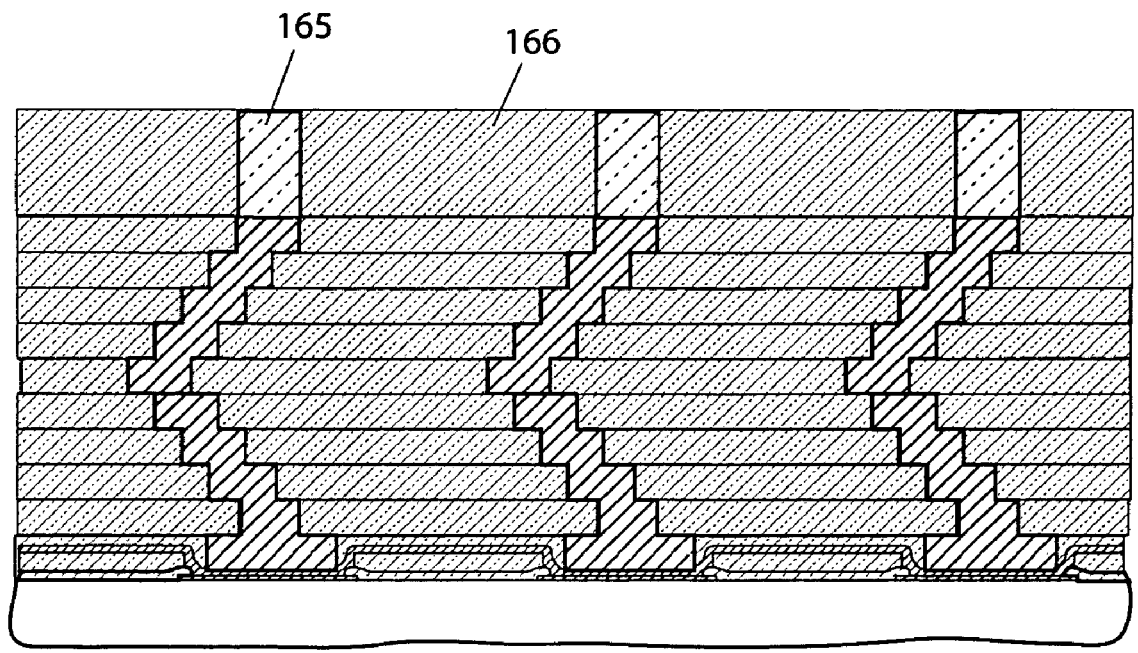
Figure 9T:
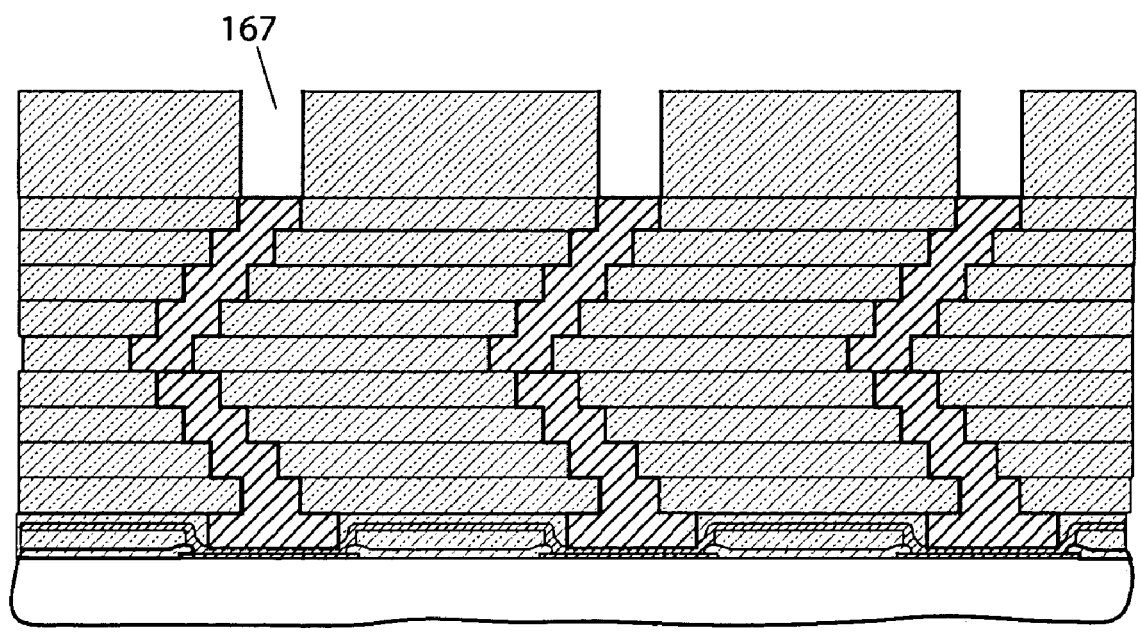
Figure 9U:
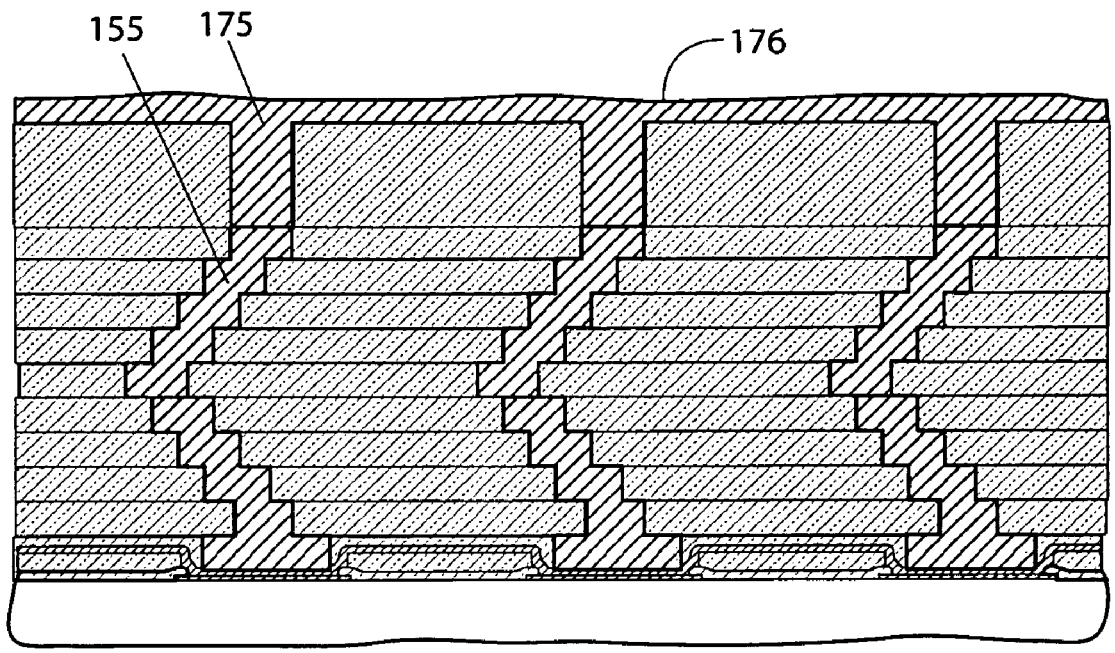
Figure 9V:
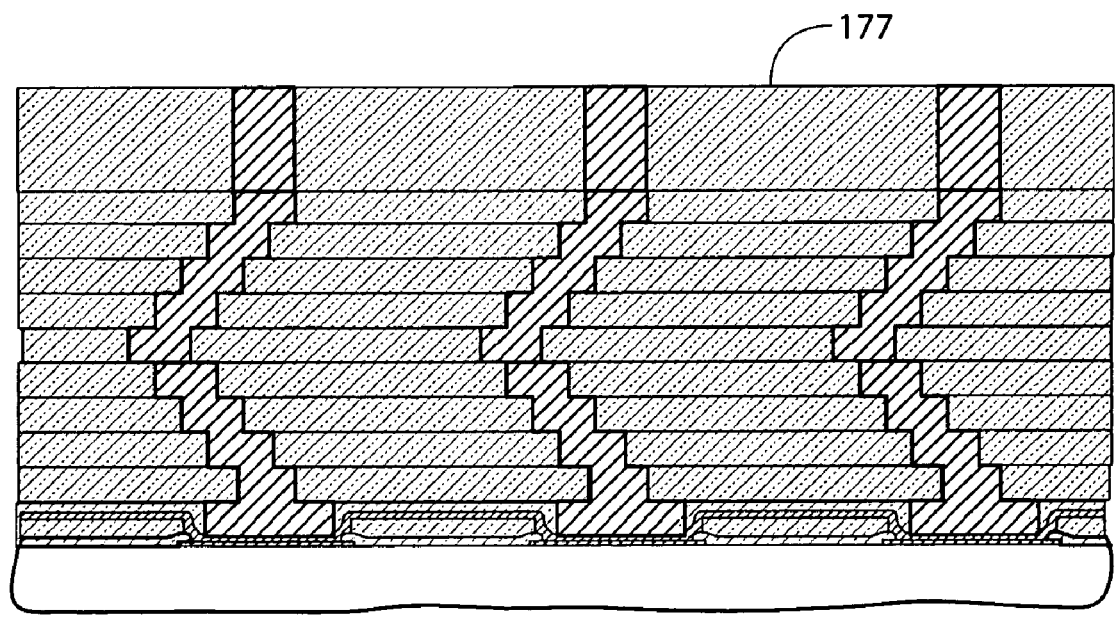
Figure 9W:
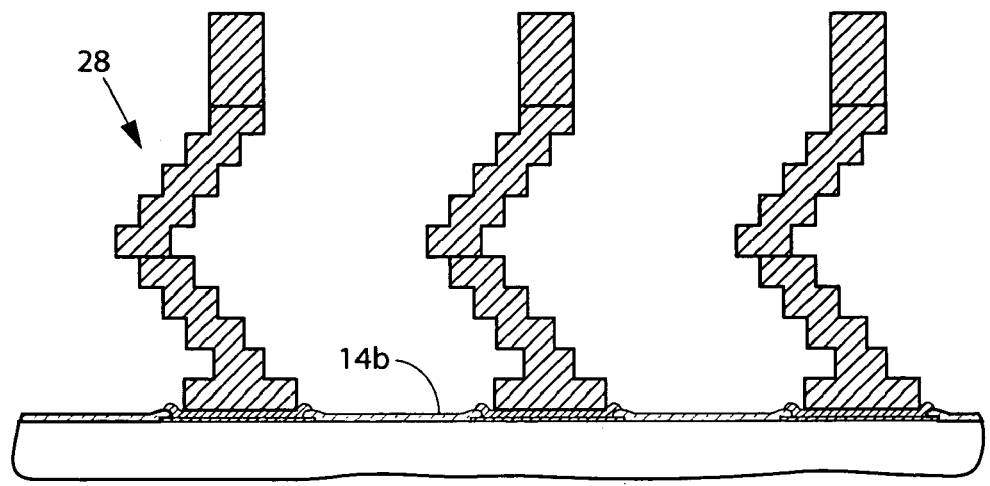
Figure 9X:
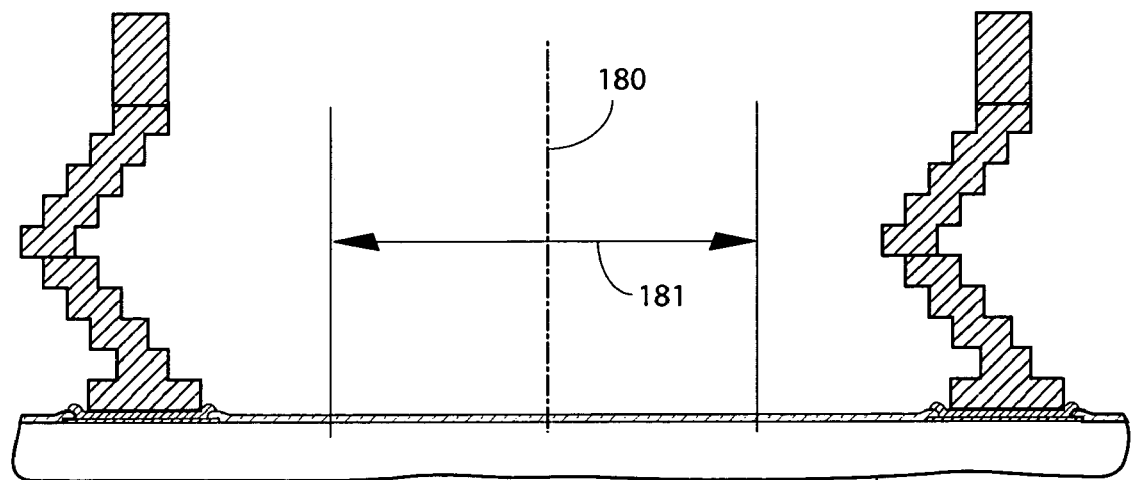

FIG. 9A-9X illustrates a sequence of preferred structures and process steps for fabricating conductive spring elements 28 of the current invention using wafer level processing. The process is briefly summarized here. A negative photo-imageable material such as BCB is preferably employed for patterning three-dimensional resist structures that enclose volumes to be plated. A conductive cathode connecting all of the I/O pads is provided for the electroforming process, plus a means for removing unwanted portions of this layer after the spring elements are formed. Slanted sections of the spring elements are built up from offset segments that form staircase structures. Since the preferred dimensions of the spring element may include an aspect ratio too large to be effectively electroformed in a single plating step, it may be broken into sections. Each section is plated separately, followed by a CMP step to remove excess copper and planarize the surface. The number of sections is somewhat arbitrary; three sections are used in the preferred embodiment.

FIG. 9A shows a semiconductor element such as IC chip 74 of FIG. 6A having I/O pads 13*b* at openings in passivation layer 14*b*, defined in FIG. 3B.

FIG. 9B includes a layer of negative resist material 120 that has been spun onto the wafer surface and soft baked. The preferred length of spring structure 28 to be fabricated is around 100 μm, and this leads to a preferred thickness of around 8 μm for resist layer 120.

FIG. 9C illustrates exposure of resist layer 120 using ultraviolet illumination 121 projected through a mask, forming cross-linked regions 122. Cross-linking of long chain polymer molecules in regions 122 causes them not to be dissolved in developer at a subsequent step. Conversely, regions like 123 are not similarly polymerized and will dissolve in developer.

FIG. 9D shows openings 124 in resist layer 120 following the development step, exposing I/O pads 13*b*.

FIG. 9E illustrates deposition of a UBM 125 for interfacing I/O pad 13*b* to the copper spring element to be electroformed. The UBM preferably consists of an adhesion layer of titanium plus a seed layer of copper. In region 126 the UBM will be later removed in a lift process by swelling underlying resist 127, to be further described in reference to FIG. 10 UBM 125 is also used as a cathode for the electroforming process in the preferred embodiment. If the input/output pads are formed of copper instead of the more typical aluminum, a UBM will not be required, and the cathode may be implemented using a single sputtered layer of copper.

In FIG. 9F a planarizing layer of resist 128 has been spun onto the surface and soft baked.

FIG. 9G illustrates exposure of resist layer 128, forming cross-linked regions 129 and un-cross-linked regions 130, which will become anchoring pads 29 for spring elements 28, defined in FIG. 3B.

FIG. 9H illustrates another planarizing layer of resist 135 spun onto the surface and soft baked.

FIG. 9I shows another exposure of ultra violet radiation 136 through a mask forming regions 137 of un-cross-linked resist that will become step segments of a stair-cased copper spring structure. Regions 137 are separated by cross-linked regions 138.

FIG. 9J shows the effect of repeating the process step shown in FIG. 9I three more times, with an offset in the mask between each exposure, forming stair-case structure 139 of un-cross-linked material.

FIG. 9K shows the result of dissolving the un-cross-linked material in developer, forming stair-case cavities 140 separated by regions 141 of cross-linked resist. Although not apparent in the figure, each cavity 140 is laterally enclosed by a web of resist that provides support for maintaining the integrity of the multi-layered resist pattern.

FIG. 9L shows the effect of electroplating up from the copper seed layer (electroforming cathode) of UBM 125, filling cavity 140 with copper and forming a stair-cased section 142 of spring element 28, plus an irregular copper surface 143 encompassing excess copper material. The aspect ratio of cavity 140 is small enough to enable effective plating of section 142.

FIG. 9M shows planarized surface 150 after a CMP polishing step, as is known in the art.

FIG. 9N shows the effect of applying five more layers of resist, each one patterned with a mask using an offset, creating stair-case section 151 of un-cross-linked resist, similar to section 139 of FIG. 9J.

FIG. 9O illustrates the development of stair-case cavity 152 connecting with stair-case section 142 of FIG. 9L as shown.

FIG. 9P shows the effect of plating up from the exposed surface of stair-case section 142, filling cavity 152 with copper to form staircase section 155, including excess copper and an irregular surface 156.

FIG. 9Q shows the effect of a CMP step to planarize surface 157 and remove the excess copper.

Although it may be possible to insert an end of a spring structure into a well without forming a straight end (shaped terminus), the preferred embodiment includes a straight section at the end of spring element 28, for ease of interfacing with its matching well filled with solder. Accordingly, FIG. 9R shows a layer of resist 158 having a thickness of approximately 20 μm, corresponding to the intended height of the straight end section of spring element 28.

FIG. 9S illustrates the result of exposing resist layer 158 to form un-cross-linked regions 165 separated by cross-linked regions 166 as shown.

FIG. 9T shows the result of developing the un-cross-linked regions to form cavities 167, each cavity being a volume that will form an end section of spring element 28.

FIG. 9U shows the effect of plating up from the exposed surface of plated section 155, to form straight end section 175 plus excess copper 176.

FIG. 9V shows the result of a CMP step to planarize surface 177 and remove excess copper.

FIG. 9W shows the result of stripping all of the cross-linked resist, all the way down to passivation layer 14*b*, revealing complete spring elements 28 standing alone. It may be useful to apply heat and ultrasonic action to complete the stripping process, as well as the strategy described in reference to FIG. 10.

FIG. 9X illustrates a scribe region (dicing channel) between IC chips, including scribe center line 180 and kerf width 181. Preferably a broad region of cross-linked resist is patterned in this region to prevent copper formation in the scribe area, so as not to complicate the dicing process by requiring the diamond blade to cut through thick copper as well as semiconductor substrate 74.

Figure 10:
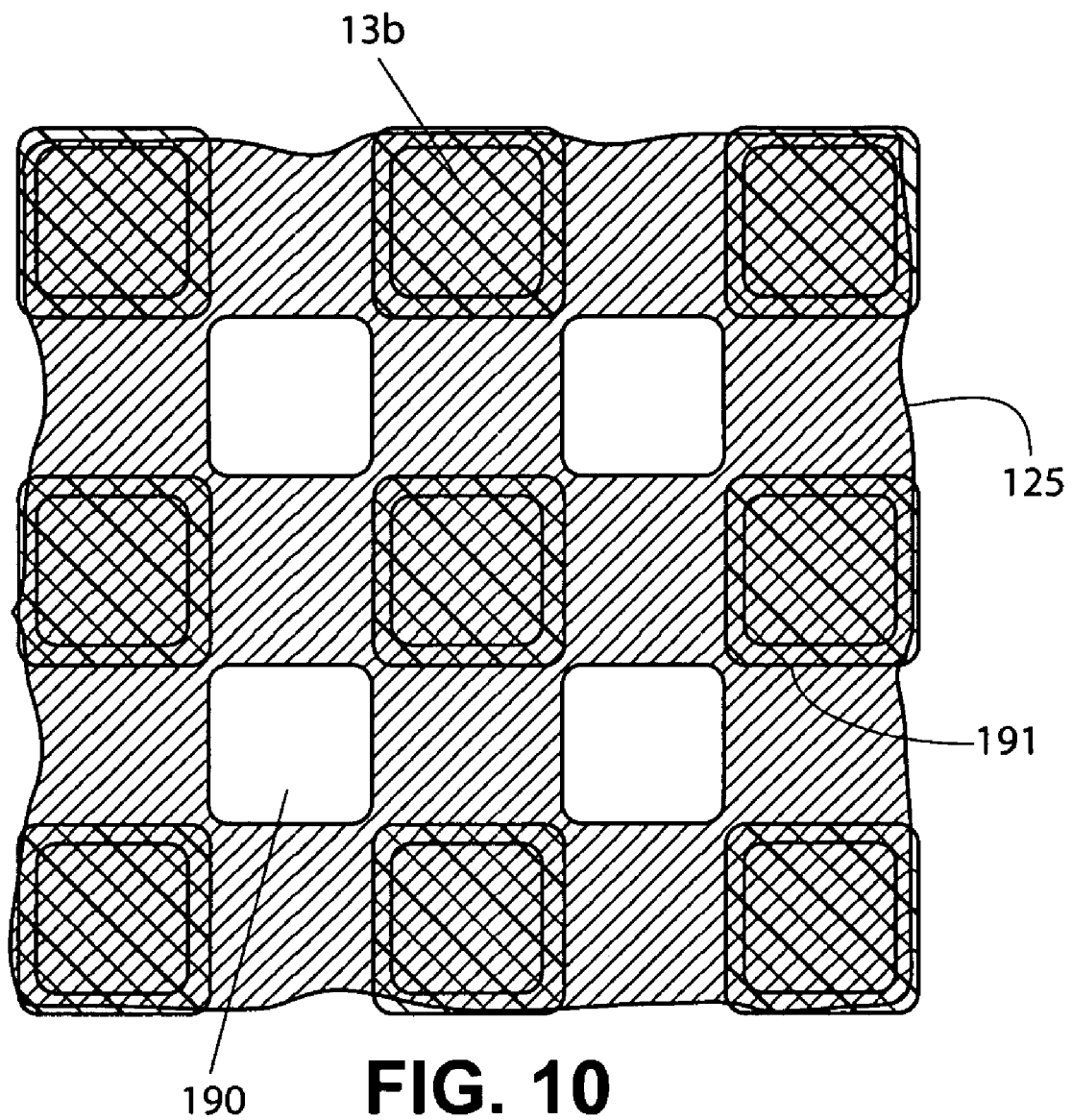
FIG. 10 shows a top view of the UBM/cathode layer, showing its extent before and after lift processing.

FIG. 10 is a top view of I/O pads 13*b*, showing the extent of UBM layer 125 of FIG. 9E. Layer 125 includes the copper seed layer, and also forms the cathode terminal of the electroplating process, necessary for fast and effective plating of the spring elements. Note that all of the I/O pads are short-circuited by layer 125. However, openings 190 are patterned in layer 125 following deposition of UBM in the process step depicted in FIG. 9E. Openings 190 allow the stripper to penetrate resist regions 127 of FIG. 9E, resulting in the swelling action that lifts the UBM in these areas, leaving UBM remaining only in each I/O pad region 191.

What is claimed is:

1. A connector for making a mechanically compliant flip chip connection between an input/output pad of an integrated circuit and a trace of an interconnection circuit comprising:
    a metallic spring element integrally formed on said input/output pad;
    a well having conductive walls connected to said trace of said interconnection circuit;
    a conductive material substantially filling said well; and,
    wherein the metallic spring element has a terminus that is inserted into said conductive material in said well to make said flip chip connection.

2. The flip chip connector of claim 1 wherein said conductive material is a conductive fluid or paste.

3. The flip chip connector of claim 1 wherein said conductive material is hardened after said insertion to bind the terminus of said spring structure in said conductive material in said well.

4. The flip chip connector of claim 1 wherein said conductive material is a solder having a paste form for said insertion and a solid form for said binding.

5. The flip chip connector of claim 2 wherein said conductive fluid or paste is a liquid metal.

6. A repairable electronic subsystem comprising:
    a semiconductor integration platform having female terminals comprising wells filled with conductive material;
    one or more semiconductor elements that attach to said integration platform, said semiconductor elements having a conductive spring element formed at each input/output pad and each spring element including a terminus; and,
    wherein said attachment of said semiconductor elements to said integration platform is accomplished by inserting said terminus into said well filled with said conductive material.

7. The repairable electronic subsystem of claim 6 wherein said semiconductor elements attach to both sides of said integration platform, and said integration platform includes through wafer connections.

8. The repairable electronic subsystem of claim 6 having two or more of said integration platforms, wherein said integration platforms are electrically connected using input/output plugs implemented as specific forms of said semiconductor elements, said input/output plugs having through wafer connections spaced on a grid.

9. The repairable electronic subsystems of any one of claims 6-8 wherein said conductive material is a conductive fluid or paste.

10. The repairable electronic subsystems of any one of claims 6-8 wherein said conductive material is a solder.

11. The repairable electronic subsystem of claim 6 and including an interface adaptor that is thermally connected with said integration platform or one or more of said semiconductor elements, said interface adaptor including a planar base layer and flexible fingers extending from said base layer, and said thermal connection is achieved using said flexible fingers.

12. The repairable electronic subsystem of claim 6 and including a cable attached to said integration platform wherein said cable has integral spring elements formed at input/output pads, and each spring element has a terminus, and attachment is achieved by inserting each of said terminus into a corresponding one of said female terminals of said integration platform.

13. An integrated circuit assembly comprising:
a semiconductor substrate in which circuits are fabricated;
bump or wire-like terminals formed at input/output pads on a first side of said semiconductor substrate; and,
an interface adaptor including flexible fingers and a base layer supporting said fingers, wherein an end of each of said fingers attaches to a second side of said semiconductor substrate opposite the first side.

14. A semiconductor integration platform comprising:
a semiconductor substrate having conductive traces;
an assembly layer on one or both sides of said substrate;
at least one array of wells having conductive walls formed in said assembly layer, said array of wells adapted to accept a component to be attached;
electrical connection between said conductive walls and selected ones of said traces; and,
conductive material substantially filling said wells.

15. The semiconductor integration platform of claim 14 and further including through wafer connections in said semiconductor substrate.

16. The semiconductor integration platform of claim 14 and further including active and/or passive circuits fabricated in said semiconductor substrate.

* * * * *